United States Patent [19]
Peuse et al.

[11] Patent Number: 5,755,511
[45] Date of Patent: May 26, 1998

[54] METHOD AND APPARATUS FOR MEASURING SUBSTRATE TEMPERATURES

[75] Inventors: Bruce W. Peuse, San Carlos; Gary E. Miner, Newark; Mark Yam, San Jose, all of Calif.

[73] Assignee: Applied Materials, Inc., Santa Clara, Calif.

[21] Appl. No.: 641,477

[22] Filed: May 1, 1996

Related U.S. Application Data

[63] Continuation-in-part of Ser. No. 359,302, Dec. 19, 1994.

[51] Int. Cl.$^6$ .................... G01J 5/00; G01K 15/00
[52] U.S. Cl. .................... 374/128; 374/2; 374/110; 374/126
[58] Field of Search .................... 374/2, 110, 126, 374/128, 130, 131; 356/73

[56] References Cited

U.S. PATENT DOCUMENTS

| | | |
|---|---|---|
| 3,796,099 | 3/1974 | Shimotsuma et al. |
| 4,408,878 | 10/1983 | Fischbach . |
| 4,611,930 | 9/1986 | Stein . |
| 4,659,234 | 4/1987 | Brouwer et al. |
| 4,708,474 | 11/1987 | Suarez-Gonzalez . |
| 4,881,823 | 11/1989 | Tanaka et al. |
| 4,919,542 | 4/1990 | Nulman et al. |
| 4,956,538 | 9/1990 | Moslehi . |
| 4,979,134 | 12/1990 | Arima et al. |
| 5,011,295 | 4/1991 | Krishnan et al. |
| 5,029,117 | 7/1991 | Pattoon . |
| 5,156,461 | 10/1992 | Moslehi et al. |
| 5,226,732 | 7/1993 | Nakos et al. |
| 5,326,171 | 7/1994 | Thompson et al. |

FOREIGN PATENT DOCUMENTS 0 612 862 A1   8/1994   European Pat. Off. .

OTHER PUBLICATIONS

Doering, "Microelectronics Manufacturing Science and Technology Program Extends Capabilities in Integrated-Circuit Manufacturing", Microelectronics Manufacturing Science & Technology, 2–64 (1994).

Apte et al., "Rapid Thermal Processing Uniformity Using Multivariable Control of a Circularly Symmetric 3 Zone Lamp", IEEE Transactions on Semiconductor Manufacturing, 5, 180–188 (1992).

Roozeboom, "Manufacturing Equipment Issues in Rapid Thermal Processing", Rapid Thermal Processing Science and Technology 349–423 (1993).

(List continued on next page.)

*Primary Examiner*—William A. Cuchlinski, Jr.
*Assistant Examiner*—Andrew Hirshfeld
*Attorney, Agent, or Firm*—Fish & Richardson P.C.

[57] ABSTRACT

A method of correcting a temperature probe reading in a thermal processing chamber for heating a substrate, including the steps of heating the substrate to a process temperature; using a first, a second and a third probe to measure the temperature of the substrate, the first and third probes having a first effective reflectivity and the second probe having a second effective reflectivity, the first probe producing a first temperature indication, the second probe producing a second temperature indication and the third probe producing a third temperature indication, and wherein the first and second effective reflectivities are different; and from the first and second temperature indications, deriving a corrected temperature reading for the first probe, wherein the corrected temperature reading is a more accurate indicator of an actual temperature of the substrate than an uncorrected readings produced by both the first and second probes. Thereafter, deriving a corrected temperature reading for the third probe by adjusting the temperature correction calculated for the first probe according to the measured emissivity sensitivity associated with the environment of the third probe to provide a corrected temperature reading that is a more accurate indicator of an actual temperature of the substrate in the environment of the third probe. An apparatus for carrying out the method is also disclosed.

17 Claims, 18 Drawing Sheets

OTHER PUBLICATIONS

Pikashov et al., Determining Emissivity And True Surface Temperature By Means Of A Pyrometer And An Attachment, Gas Institute, Kiev., translated from inzhenerno–Fizicheskii Zhurnal, 16, 723–730 (1969).

Roozeboom, "Rapid Thermal Processing: Status, Problems and Options After the First 25 Years", Mat. Res. Soc. Symp. Proc. 303, 149–164 (1993).

Gyurcsik, et al., "A Model For Rapid Thermal Processing: Achieving Uniformity Through Lamp Control", IEEE Transactions on Semiconductor Manufacturing, 4, 9–13 (1991).

Sorrell et al., "Temperature Uniformity in RTP Furnaces", IEEE Transactions on Electron Devices 39, 75–80 (1992).

A. Honda et al., "New Radiation Thermometry Using Multiple Reflection For Temperature Measurement of Steel Sheets", American Institute of Physics 923–927.

A. Gouffé, Revue D'optique 24, 1–10 (1945) with translation.

Dilhac et al., "Temperature Control in a Rapid Thermal Processor", IEEE Transactions on Electron Devices, 39 201–203 (1992).

Norman, "Optimization of Transient Temperature Uniformity in RTP Systems", IEEE Transactions On Electron Devices 39, 205–207 (1992).

Deardorff, "Elimination of reflection errors in emissometers by using alternate apertures," Rev. Sci. Instrum., vol. 47 No. 10:1279–1282 (Oct. 1976).

TO PYROMETER

TO PYROMETER

TO PYROMETER

TO PYROMETER

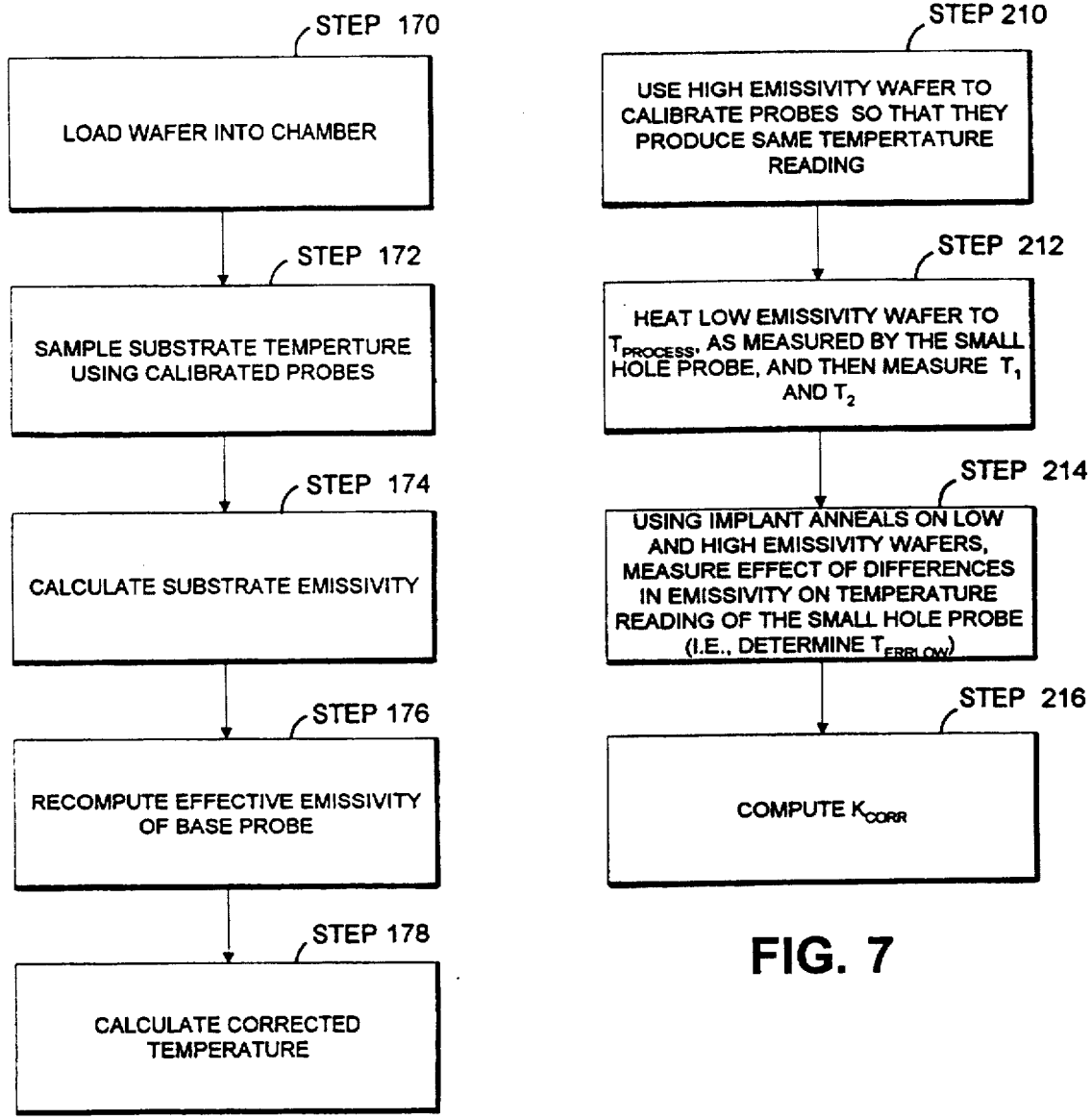

METHOD AND APPARATUS FOR MEASURING SUBSTRATE TEMPERATURES

BACKGROUND OF THE INVENTION

This is a continuation-in-part of U.S. Ser. No. 08/359,302, entitled "A METHOD AND APPARATUS FOR MEASURING SUBSTRATE TEMPERATURES", filed on Dec. 19, 1994.

The invention relates to techniques for making improved noncontact temperature measurements of a semiconductor substrate by correcting measurements of substrate temperature and by compensating for the emissivity sensitivity variations across the surface of the substrate.

In many semiconductor device manufacturing processes, the required high levels of device performance, yield, and process repeatability can only be achieved if the temperature of a substrate (e.g., a semiconductor wafer) is tightly controlled during processing. To achieve that level of control, it is often necessary to measure the substrate temperature in real time and in situ, so that any unexpected temperature variations can be immediately detected and corrected.

For example, consider rapid thermal processing (RTP), which is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). In the particular application of CMOS gate dielectric formation by RTO or RTN, thickness, growth temperature, and uniformity of the gate dielectrics are critical parameters that influence the overall device performance and fabrication yield. Currently, CMOS devices are being made with dielectric layers that are only 60–80 Å thick and for which thickness uniformity must be held within ±2 Å. This level of uniformity requires that temperature variations across the substrate during high temperature processing cannot exceed a few °C.

The wafer itself often cannot tolerate even small temperature differentials during high temperature processing. If the temperature difference is allowed to rise above 1°–2° C./cm at 1200° C., the resulting stress is likely to cause slip in the silicon crystal. The resulting slip planes will destroy any devices through which they pass. To achieve that level of temperature uniformity, reliable real-time, multi-point temperature measurements for closed-loop temperature control are necessary.

Optical pyrometry is being widely used for measuring temperatures in RTP systems. Pyrometry exploits a general property of objects, namely, that objects emit radiation with a particular spectral content and intensity that is characteristic of their temperature. Thus, by measuring the emitted radiation, the objects temperature can be determined. A pyrometer measures the emitted radiation intensity and performs the appropriate conversion to obtain temperature (T). The relationship between spectral emitted intensity and temperature depends on the spectral emissivity of the substrate and the ideal blackbody radiation-temperature relationship, given by Planck's law:

$$I_b(\lambda,T) = \frac{2C_1}{\lambda^5 \left(e^{\frac{C_2}{\lambda T}} - 1\right)} \quad (1)$$

where $C_1$ and $C_2$ are known constants, $\lambda$ is the radiation wavelength of interest, and T is the substrate temperature measured in °K. According to an approximation known as Wein's distribution law, this expression can be rewritten as follows:

$$I_b(\lambda,T) = K(\lambda) \cdot e^{-\frac{C_2}{\lambda T}} \quad (2)$$

where $K(\lambda)=2C_1/\lambda^5$. This is a good approximation for temperatures below about 2700° C.

The spectral emissivity $\epsilon(\lambda,T)$ of an object is the ratio of its emitted spectral intensity $I(\lambda,T)$ to that of a blackbody at the same temperature $I_b(\lambda,T)$. That is, $$\epsilon = \frac{I(\lambda,T)}{I_b(\lambda,T)} \quad (3)$$

Since $C_1$ and $C_2$ are known constants, under ideal conditions, the temperature of the wafer can be accurately determined if $\epsilon(\lambda,T)$ is known.

As was described previously, variations in temperature across the surface of a substrate of more than a degree or two may result in damage to the substrate and undesirable process variations. One method for monitoring the temperature at various localized regions of the substrate includes the use of a plurality of temperature probes (pyrometers or the like). In these multi-probe systems, temperature readings from the various probes can be used for real-time control of the heating element in the RTP of substrates.

However, despite its widespread use in the semiconductor industry, optical pyrometry still suffers from limitations due to an inability to accurately measure the emissivity of the substrate. Moreover, even if the emissivity of the substrate is known at a given temperature, it may change with temperature. The changes are usually not accurately measurable and thus they introduce an unknown error into the temperature measurements. Errors on the order of 10° C. or more are not uncommon.

The spectral emissivity of a substrate depends on many factors, including the characteristics of the wafer itself (e.g. temperature, surface roughness, doping level of various impurities, material composition and thickness of surface layers) and the process history of the wafer. Another related term is the effective emissivity of an object. The effective emissivity is the ratio of the measured spectral intensity emitted by the object to that of a blackbody at the same temperature. The effective emissivity of an object differs from the spectral emissivity for the same object in that the effective emissivity takes into account the environment in which the object resides. The effective emissivity of a substrate may be influenced by the characteristics of the process chamber in which the substrate is positioned. Therefore, a priori estimation of substrate emissivity cannot provide a general purpose pyrometric temperature measurement capability.

In addition, the environment at each probe in a multi-probe system is unique. A pyrometric probe positioned in one of these unique environments may exhibit sensitivity to substrates having particular emissivity characteristics, introducing an error component in the temperature reading. Across the surface of the substrate, one or more of the probes may exhibit differing sensitivities to the emissivity of the substrate (hereinafter referred to as emissivity sensitivity across the surface of the substrate). Substrates having a generally low emissivity level may exhibit large variations in emissivity sensitivity over the surface of the substrate. Accordingly, a multi-probe temperature measurement system which does not account for variations in the emissivity sensitivity across the surface of the substrate may produce less than optimal results.

Systems which only seek to compensate for emissivity errors by a singular approximation of emissivity for the entire substrate will lead to acceptable results; however, room for improvement exists.

SUMMARY

In general, in one aspect the invention is a method of correcting a temperature probe reading in a thermal processing chamber for heating a substrate. The method includes heating the substrate to a process temperature; using a first probe, second probe and at least a third probe to measure the temperature of the substrate; from first and second temperature indications produced by the first and second probes, respectively, deriving a corrected temperature reading for the first probe that is a more accurate indicator of an actual temperature of the substrate in the environment of the first probe than are uncorrected readings produced by both the first and second probes; the corrected temperature reading being the sum of an adjustment temperature and the measured temperature from the first probe; and, from the adjustment temperature derived for the first probe and the third temperature indication, deriving a corrected temperature reading for the third probe, wherein the corrected temperature reading for the third probe is a more accurate indicator of an actual temperature of the substrate in the environment of the third probe than are uncorrected readings produced by the third probe.

The invention also includes using a noncontacting probe for the first, second and third probes, e.g. optical pyrometers. The temperature measurements that are performed using the first, second and third probes are performed closely in time, e.g. concurrently. The first effective reflectivity which is associated with the first probe, is larger than the second effective reflectivity, which is associated with the second probe. The corrected temperature reading for the third probe is the sum of the product of the adjustment temperature multiplied by a sensitivity factor and the third temperature indication. The deriving step for the third probe comprises computing a sensitivity factor for the third probe location, and where the product of the sensitivity factor for the third probe and the adjustment temperature derived for the first probe is summed with the third temperature indication to yield the corrected temperature reading for the third probe. The sensitivity factor is computed by determining the temperature variation from an average temperature applied for a plurality of calibration substrates having predetermined emissivity levels, e.g., where at least one substrate has a high emissivity level, at least one having a low emissivity level and at least one has an emissivity level between the high and low levels. The sensitivity factor for the third probe is determined by a straight line approximation of a sensitivity curve associated with the corrected temperature data derived for the first probe and the localized temperature variation from the average temperature applied for the calibration substrates.

In another aspect of the invention, an apparatus for measuring the temperature of a substrate in a thermal processing heating chamber includes a reflecting plate placed next to one surface of the substrate to form a reflecting cavity therebetween. A first probe is positioned to receive energy from the reflecting cavity and produce a first temperature reading. A second probe is positioned to receive energy from the reflecting cavity and produce a second temperature reading. The first probe having associated therewith a different effective reflectivity for the cavity than the second probe. At least one third probe is positioned to receive energy from the reflecting cavity and produce a third temperature reading. The third probe having associated therewith approximately the same effective reflectivity for the cavity as the first probe. A temperature measurement module receives first, second and third temperature indications from the first, second and third probes, respectively. The module is programmed to derive a corrected temperature reading for the first probe from the first and the second temperature indications. The corrected temperature reading for the first probe is the sum of the first temperature indication and a calculated adjustment temperature. The corrected temperature reading is a more accurate indicator of the actual temperature of the substrate at the region associated with the first probe than are uncorrected readings of the first and second probes.

Embodiments of the invention include the following features. The first, second and third probes comprise light pipes. The first, second and third probes are positioned in a first, a second and a third hole, respectively. The first, second and third holes formed in the reflecting plate. The second hole is larger than the first and the third holes. The temperature measurement module computes a sensitivity factor for the third probe location. The product of the sensitivity factor for the third probe and the adjustment temperature derived for the first probe is summed with the third temperature indication to yield the corrected temperature reading for the third probe. The sensitivity factor is computed by determining the temperature variation from an average temperature applied for a plurality of calibration substrates having predetermined emissivity levels. The plurality of calibration substrates including at least one substrate having a high emissivity level, at least one having a low emissivity level and at least one having an emissivity level between the high and low levels. The sensitivity factor for the third probe is determined by a straight line approximation of a sensitivity curve associated with the corrected temperature data derived for the first probe and the localized temperature variation from the average temperature applied for the calibration substrates.

Among the advantages of the invention are the following. The invention provides real time, in situ temperature compensation that accommodates variations in emissivity sensitivity (across the surface of the substrate) as a function of temperature. The calibration procedure is simple and typically only needs to be implemented once for a given chamber structure. Temperature measuring according to the invention permits the use of stable, repeatable solid-state detectors. The invention enables reliable temperature measurements with enhanced repeatability and uniformity.

Other features and advantages will be apparent from the following description and the claims.

BRIEF DESCRIPTION OF THE DRAWINGS

FIG. 6 is a flow diagram of a scheme for measuring the emissivity in situ to enhance the accuracy of a temperature measurement;

FIG. 7 is a flow chart of an alternative technique for calibrating the temperature measurement probes in an RTP chamber;

DESCRIPTION OF THE PREFERRED EMBODIMENTS

The Virtual Blackbody Cavity

In the following description, we will refer to measuring the temperature of a substrate. We intend the term "substrate" to broadly cover any object that is being processed in a thermal process chamber and the temperature of which is being measured during processing. The term "substrate" includes, for example, semiconductor wafers, flat panel displays, glass plates or disks, and plastic workpieces.

To understand the present invention, it will be useful to first review the emissivity enhancement technique referred to above.

Figure 1:
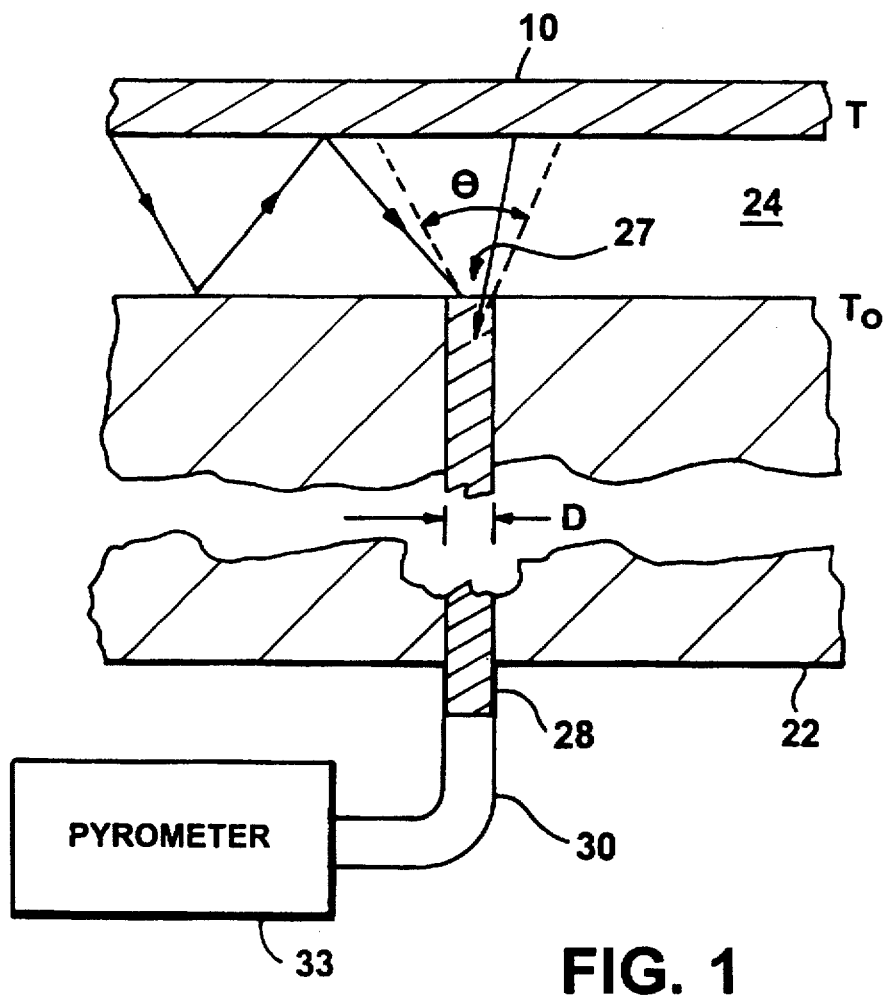
FIG. 1 is a diagrammatic cross-sectional side view of a substrate temperature measuring scheme in which a reflector is positioned near a substrate.

As shown in FIG. 1, a thermal reflector 22 is positioned near substrate 10 to create a virtual blackbody cavity 24 between the reflector and the substrate. If the substrate backside is diffuse, the radiation is emitted from it in a random pattern and thus the emitted radiation is reflected throughout the cavity in an equally random (isotropic) pattern. The radiation arriving at any location on the surface of reflector 22 is made up of many components: one component is made up of the radiation coming directly from the substrate and has experienced no reflections; a second component has experienced only one reflection off of reflector 22 and the backside of substrate 10; a third component has experienced two reflections off of reflector 22 and the backside of substrate 10; etc. The total intensity available at a point on the reflector plate can be found by summing over an infinite series of components of impinging radiation as follows:

$$I_T = \epsilon \cdot \sigma \cdot T^4 \cdot \sum_n R^n \cdot (1-\epsilon)^n \tag{5A}$$

$$I_T = \frac{\epsilon \cdot \sigma \cdot T^4}{1 - R(1-\epsilon)} \tag{5B}$$

where the reflectivity of the cold reflector plate is given by R, the emissivity of the wafer by $\epsilon$ and where $\sigma$ is the Stefan-Boltzman constant and T is the temperature of the substrate.

Assuming that the reflectivity of the reflector is equal to one (R=1), then Eq. 5B reduces to:

$$i_T = \sigma T^4, \tag{5C}$$

in which the radiation $I_T$ is independent of emissivity of the backside of the substrate. Stated differently, the reflector produces a virtual blackbody cavity for which the "effective emissivity" of the substrate is equal to 1.

Note that this emissivity enhancing effect does not require that the backside of the wafer be diffuse. It will work for substrates having backsides that are perfectly specular reflectors as well as for substrates having backsides that are highly diffuse. As noted above, semiconductor wafer backsides are some combination of diffuse and specular.

A light pipe 28 is used to sample radiation in the cavity through an aperture 27 in the reflector. The sampled intensity is passed through an optical fiber 30 to a pyrometer 33 where it is converted to temperature by using Eq. 5, above. Because of the virtual blackbody cavity effect, the measured temperature will be independent of changes in emissivity of the substrate.

In reality, however, the reflectivity of the reflector, though close to 1, will not be equal to 1. For one thing, the coating on the reflector will not be perfectly reflecting. For example, gold which is one of the better reflective coating materials, has a reflectivity of only about 0.975 at a wavelength of 950 nm (nanometers). In addition, it has become apparent that the presence of the one or more apertures in the reflector for sampling the radiation, as well as the overall geometry of the cavity (i.e., dimensions and shape), also tend to lower the performance of the virtual blackbody cavity we are trying to create here. These geometric effects together with the actual reflectivity can be lumped together into an "effective reflectivity" term $R_{eff}$. Though it is possible to substantially reduce the impact that changes in substrate emissivity have on the sampled intensity, the measurements will nevertheless not be completely independent of the emissivity of the substrate.

Assuming reflector 22 is opaque, cold, and highly reflective (i.e., R→1), we can ignore the effects of radiation emitted by the reflector, and the effective emissivity, $\epsilon_{eff}$, of the substrate can be approximated by:

$$\epsilon_{eff}(\epsilon, R_{eff}) = \frac{\epsilon}{1 - R_{eff} \cdot (1-\epsilon)} \tag{6}$$

where $R_{eff}$ is the effective reflectivity of the reflecting cavity. Note that if $R_{eff}$ does equal 1, then $\epsilon_{eff}$ will also equal 1 as it should. On the other hand, if $R_{eff}$ is less than 1, $\epsilon_{eff}$ will also be less than 1 and the measured temperature will be a function of emissivity.

Figure 2:
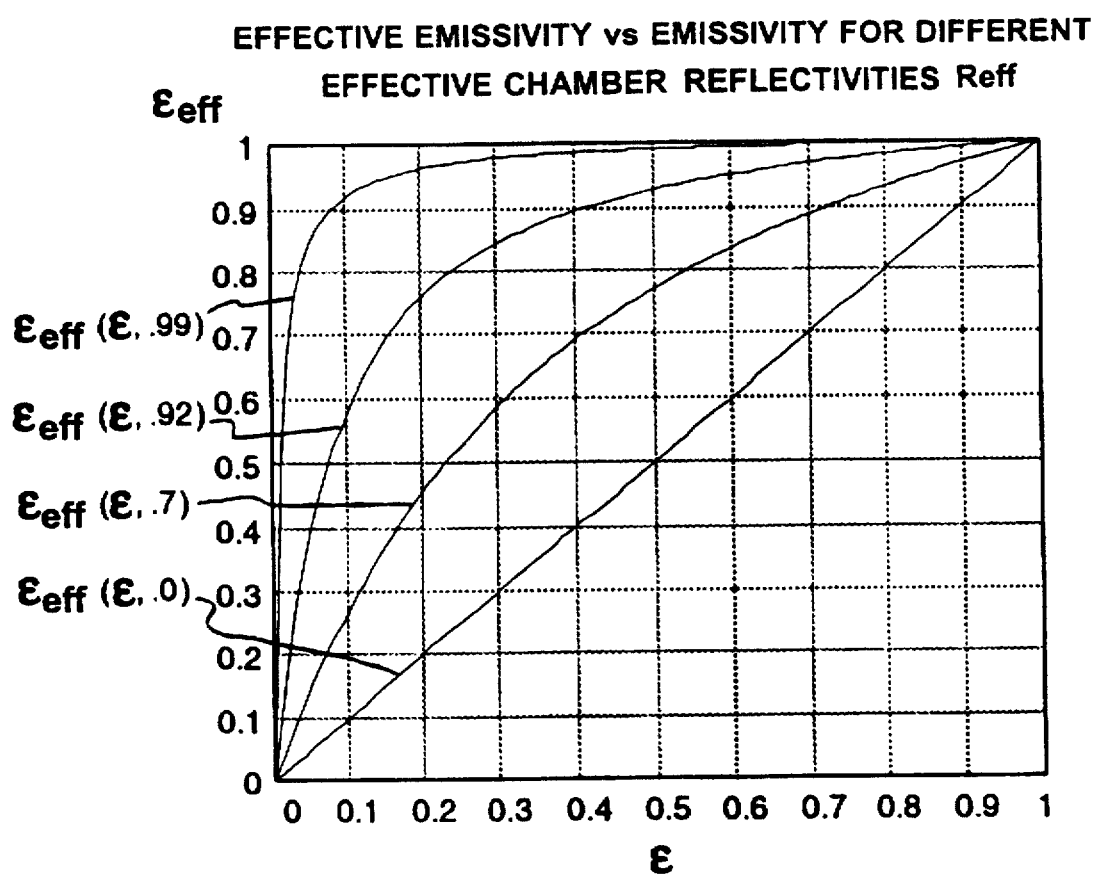
FIG. 2 is a graph of effective emissivity as a function of actual emissivity plotted for different values of effective reflectivity.

In FIG. 2, effective emissivity, $\epsilon_{eff}$ is plotted as a function of the actual emissivity, $\epsilon$, for different values of $R_{eff}$. As indicated, the effective emissivity of the substrate approaches 1 as the effective reflectivity of the reflecting cavity approaches 1. Also, as $R_{eff}$→1, the effective emissivity of the substrate becomes less sensitive to changes in the actual emissivity of the substrate, especially for high values of actual emissivity. This sensitivity can be quantified as follows:

$$\Delta\epsilon_{\mathit{eff}} = \frac{(1-R_{\mathit{eff}}) \cdot \Delta\epsilon}{\{1-R_{\mathit{eff}} \cdot (1-\epsilon)\}^2} \qquad (7)$$

which is obtained by taking the derivative of Eq. 6 with respect to $\epsilon$.

The resulting error in the temperature measurement is related to variations in the effective emissivity as follows:

$$\frac{\Delta T}{T} = \frac{\lambda \cdot T}{C_2} \cdot \frac{\Delta\epsilon_{\mathit{eff}}}{\epsilon_{\mathit{eff}}} . \qquad (8a)$$

Using Eqs. 6 and 7, we obtain:

$$\frac{\Delta T}{T} = \frac{\lambda \cdot T}{C_2} \cdot \frac{(1-R_{\mathit{eff}})}{\{1-R_{\mathit{eff}} \cdot (1-\epsilon)\}} \cdot \frac{\Delta\epsilon}{\epsilon} .$$

Note that as $R_{\mathit{eff}}$ approaches one, the numerator and thus, the sensitivity of the measured temperature to changes in substrate emissivity, become vanishingly small. Conversely, if the effective reflectivity of the cavity is not sufficiently high (i.e., close to one), the variations in the temperature measurement that are due to variations in substrate emissivity can remain unacceptably large.

Referring again to FIG. 1, the presence of aperture 27 introduces a localized disturbance in the virtual blackbody cavity 24 created between the reflector and the substrate. We have come to realize that such disturbances also reduce the emissivity-enhancing effect produced by the reflector. Moreover, the size of the disturbance tends to increase with increasing aperture size (D). Thus, one approach to minimizing the effect of the aperture on emissivity enhancement might be to reduce the size of the aperture. However, since the amount of light collected by the light pipe is proportional to the area of the aperture, this reduces the amount of light collected by the light pipe which, in turn, reduces the signal-to-noise ratio of the detection system. Since radiation intensity drops off rapidly as substrate temperature decreases, using a smaller aperture can significantly increase the temperature below which the detector is no longer useful.

We have discovered, however, that by modifying the base reflector in an RTP system to include a measurement-enhancing surface feature at the end of the light probe, we can further increase the virtual blackbody effect of the reflecting cavity while also obtaining an improved signal-to-noise in the sampled signal.

An RTP System Incorporating the Invention

Overview of the RTP System

Figure 3B:
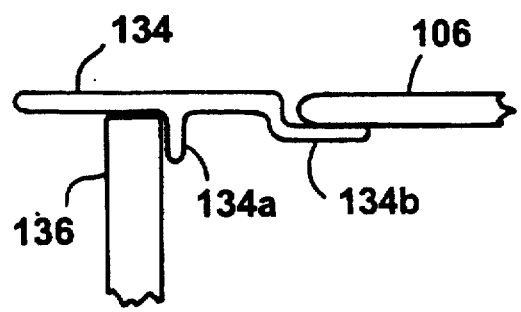
FIG. 3B shows details of the support ring.
Figure 3A:
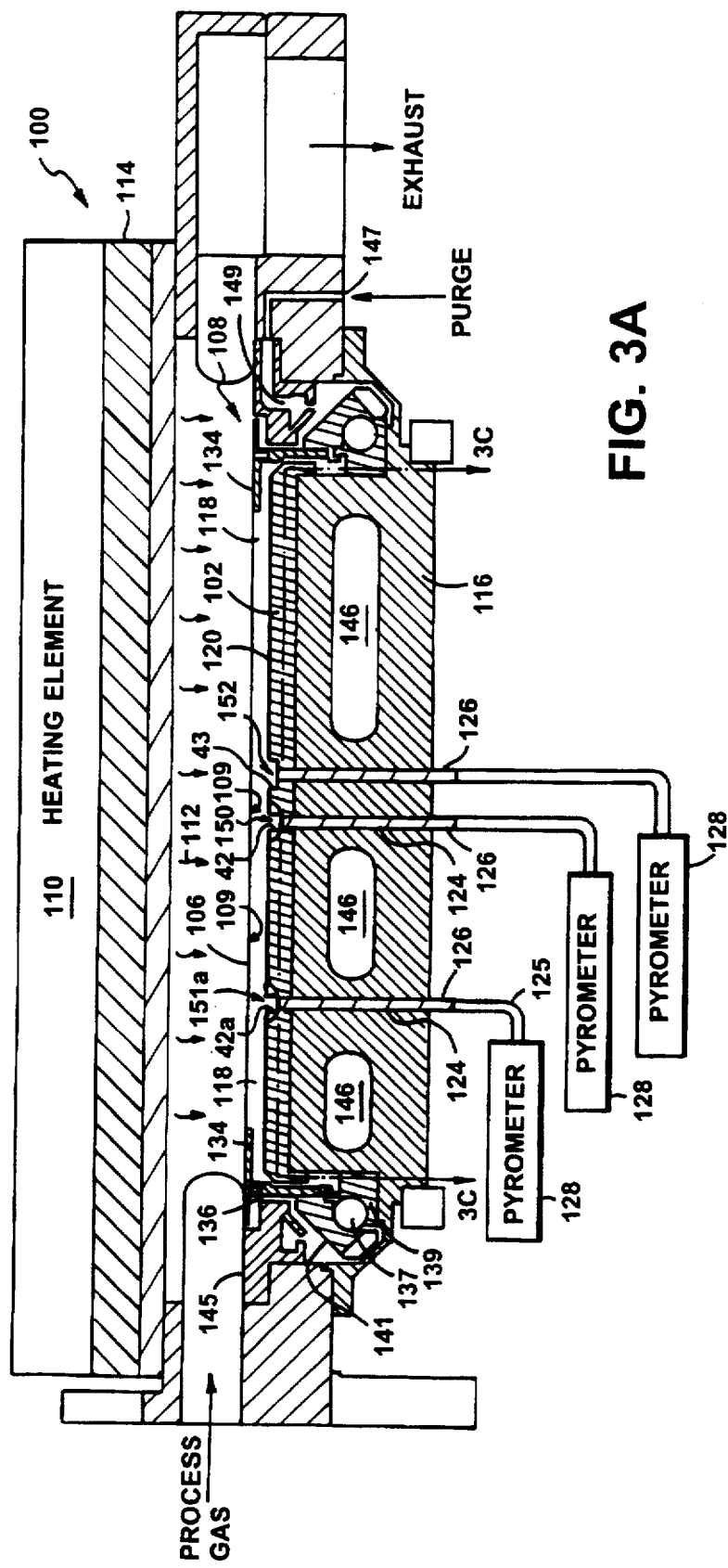
FIG. 3A is a cross-sectional side view of an RTP system.

An RTP system that has been modified in accordance with the invention is shown in FIG. 3A. The RTP system includes a processing chamber 100 for processing a disk-shaped, eight inch (200 mm) diameter silicon substrate 106. The substrate 106 is mounted inside the chamber on a substrate support structure 108 and is heated by a heating element 110 located directly above the substrate. The heating element 110 generates radiation 112 which enters the processing chamber 100 through a water-cooled quartz window assembly 114 which is approximately one inch (2.5 cm) above the substrate. Beneath substrate 106 is a reflector 102 which is mounted on a water-cooled, stainless steel base 116. Reflector 102 is made of aluminum and has a highly reflective surface coating 120. The underside of substrate 106 and the top of reflector 102 form a reflecting cavity 118 for enhancing the effective emissivity of the substrate.

The separation between the substrate and reflector is approximately 0.3 inch (7.6 mm), thus forming cavity which has a width-to-height ratio of about 27. In processing systems that are designed for eight-inch silicon wafers, the distance between the substrate 106 and reflector 102 is between 3 mm and 9 mm, and preferably between 5 mm and 8 mm and the width-to-height ratio of cavity 118 should be larger than about 20:1. If the separation is made too large, the emissivity-enhancement effect that is attributable to the virtual blackbody cavity that is formed will decrease. On the other hand, if the separation is too small, e.g. less than about 3 mm, then the thermal conduction from the substrate to the cooled reflector will increase, thereby imposing an unacceptably large thermal load on the heated substrate. Since the main mechanism for heat loss to the reflecting plate will be conduction through the gas, the thermal loading will, of course, depend upon the type of gas and the chamber pressure during processing.

The temperatures at localized regions 109 of substrate 106 are measured by a plurality of temperature probes 126 (only two of which are shown in FIG. 3A). The temperature probes are sapphire light pipes that pass through a conduit 124 that extends from the backside of base 116 through the top of reflector 102. Sapphire light pipes 126 are about 0.125 inch in diameter and conduits 124 are slightly larger to enable them to be easily inserted into the conduits.

The Emissivity Enhancing Surface Features

Figure 4A:
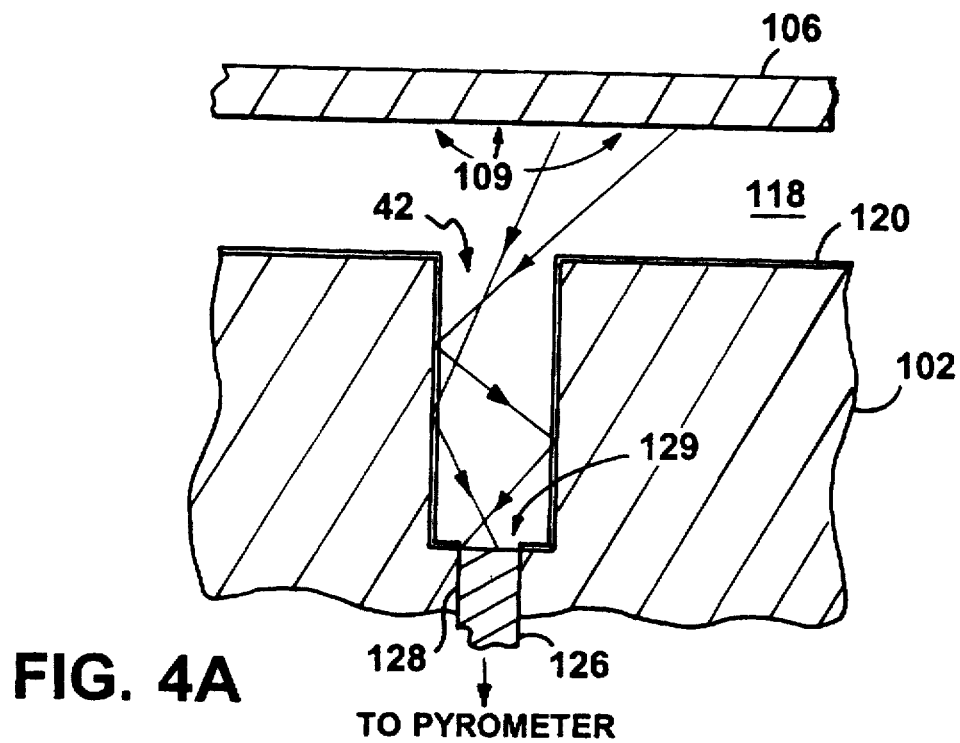
FIGS. 4A–4D are cross-sectional side views of various measurement-enhancing surface features that are incorporated into the reflector.

In accordance with one aspect of the invention, a small reflective cavity 42 (i.e., a microcavity) is formed in the top surface of reflector 102 where the conduit passes through to the top of the reflector (shown more clearly in FIG. 4A). The conduit enters the small cavity forming an aperture 129 at the bottom of the small cavity. Sapphire light pipe 126 is positioned within conduit 124 so that its uppermost end is flush with or slightly below the bottom of microcavity 42. The other end of light pipe 126 couples to a flexible optical fiber 125 that transmits sampled light from the cavity to a pyrometer 128.

In the described embodiment, the surface microcavity is cylindrically shaped, has a radius (R) of about 0.100 inch and a depth (L) of about 0.300 inch. Aperture 129 at the bottom of microcavity 42 and conduit 124 are slightly larger than about 0.125 inch, which as noted above, is the diameter of the sapphire light pipe. Surface microcavity 42 functions to enhance the virtual blackbody effect of reflecting cavity 118 that is present between the backside of substrate 106 and the top of reflector 102, thereby increasing the effective emissivity of the substrate to a value that is even closer to one. The cylindrical microcavity both increases the signal-to-noise ratio of the sampled signal that is detected by the light pipe and it functions to increase the effective emissivity of the substrate (or equivalently, the effective reflectivity of the reflecting cavity). We further note that the enhancement effect does not appear to be strongly dependent on whether the probe end is flush with the bottom of surface microcavity 42 or is placed below that point, recessed within conduit 124. Thus, the operation of inserting the probe into the conduit during the assembly of the reflector is made easier by not having to satisfy close critical tolerances regarding the placement of the probe end. However, the probe end should not protrude into the surface microcavity since this seems to degrade the enhancement effect.

Assuming perfectly reflecting sidewalls in the cylindrical microcavity, the enhancement effect caused by the cylindrical microcavity increases as the L/R ratio of the microcavity increases. However, since the sidewalls are not perfectly reflecting, the more times the collected radiation reflects back and forth within the cavity, the more its signal strength will be diminished by the losses which occur upon each reflection. Therefore, as a practical matter there is a limit to how large one can make the L/R aspect ratio of the cylindrical microcavity and still obtain improvements in performance.

Surface microcavity 42, which is formed around the end of the probe, appears to work by increasing the level of self-irradiation of a localized region of the substrate backside, by increasing the collection efficiency of the probe, or by a combination of both mechanisms. In other words, the surface cavities increase, relative to a planar reflector, the amount of light that reflects from the reflector back at the localized region 109 on the substrate at which point the temperature is to be measured and thereby also increases the probe's collection of radiation.

To achieve the high reflectivity that is desired for the reflector, a highly reflective multi-layered coating 120 is formed on top of the reflector. The bottom layer of the coating is a thin layer of gold, which is deposited onto the surface of the reflector body. Gold is preferred because it has a reflectivity of about 0.975 in the infra-red wavelength range of interest (i.e., about 950 nm). To further enhance the reflectivity of the gold layer, a quarter-wave stack is formed on top of the gold layer. The quarter-wave stack is made up of alternating dielectric layers which have different indices of refraction and have a thickness equal to ¼ of the wavelength to which the pyrometer is most sensitive (e.g., ¼ of 950 nm). In one embodiment, the quarter-wave stack was applied by OCLI (Optical Coating Laboratory, Inc.) of Santa Rosa, Calif., although other acceptable commercial sources are also available for applying such coatings.

The top layer of the multi-layered structure is a passivation layer, which prevents the gold of the reflecting layer from possibly contaminating the RTP chamber. The passivation layer may be made of silicon dioxide, aluminum oxide, silicon nitride, or any other acceptable material that will passivate the reflecting layer without degrading its reflective properties at the wavelength of interest.

The reflectivity of this multi-layered structure is about 0.995 at 950 nm, which is significantly higher than the natural reflectivity of 0.975 for a single thin gold film.

If gold is an unacceptable material for the reflecting, other reflecting materials may, of course, be used. For example, nickel is more inert than gold and has a good reflectivity, though not as high as gold.

Figure 4B:
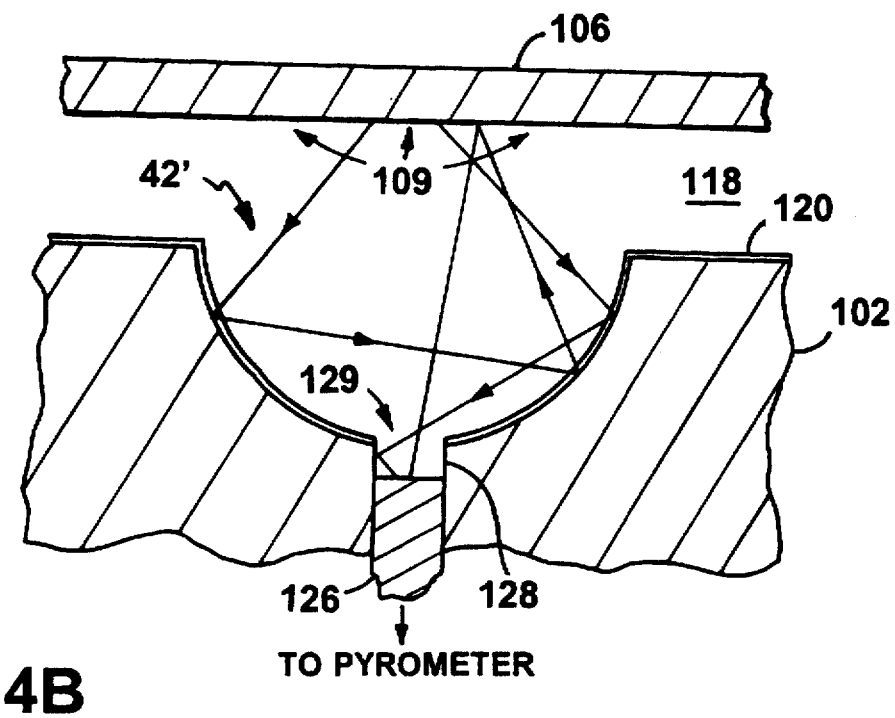

Many other alternative geometries are possible for the surface microcavity. For example, a hemispherical microcavity 42', such as is shown in FIG. 4B, may be used. The microcavity is spherical in shape, with its center located in the plane of the reflector surface. For the RTP embodiment described above, the radius of the sphere is about 6–8 millimeters, i.e., comparable to the separation between the reflector and the back of the substrate. Sapphire probe 126 is 0.080 inch in diameter, although it may be desirable to use a smaller size (e.g. 0.050 inch) to minimize the disturbance that the probe might cause to the substrate temperature in the localized region 109.

Figure 4C:
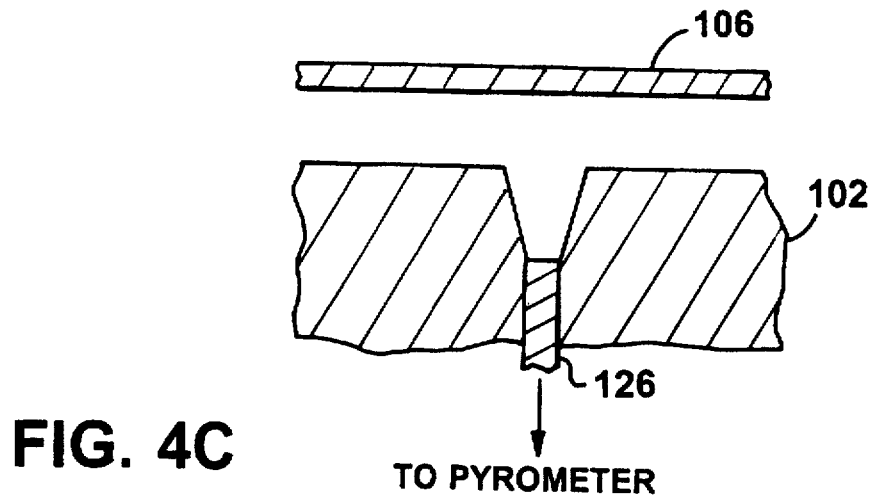
Figure 4D:
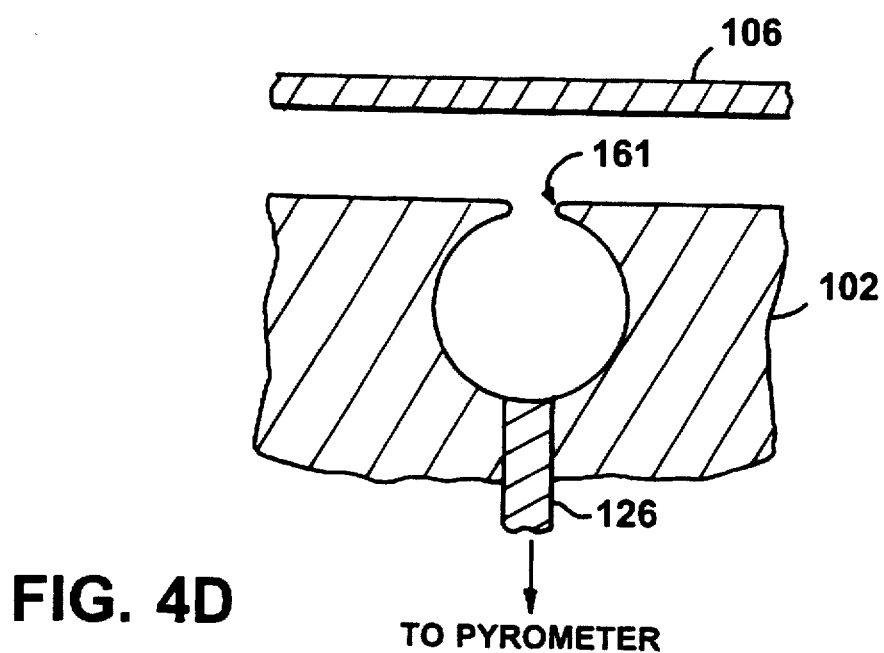

Other microcavity geometries are shown in FIGS. 4C–D. FIG. 4C shows a conical-shaped microcavity with the light pipe located at the vortex of the cone. FIG. 4D shows a spherical microcavity with the light pipe located opposite a circular aperture 161 in the surface of the reflector. These are just a few of the many alternative geometries that could be used. The particular microcavity geometry that is most appropriate for a given application can be empirically determined. In addition, the microcavity could also be a raised microcavity that is formed in material that protrudes from the surface of the reflecting plate.

Emissivity Corrected Temperature Measurements

Even though the use of a microcavity in the surface of the reflector around the end of the probe produces a reflecting cavity that more closely approximates a virtual blackbody, the effective emissivity will still not be identically equal to one. In other words, the measured temperatures will have an unknown error component attributable to variations in emissivity from one substrate to the next. In addition, the unknown error component will vary over the surface of the substrate as emissivity sensitivity varies or as the "effective emissivity" varies. Thus, it may be desirable to further improve the accuracy of each temperature measurement by measuring and correcting for variations in the effective emissivity associated with a localized area of the substrate. The accuracy of real time, in situ temperature measurement may be improved by measuring the temperature at a particular localized region of a substrate using two temperature probe assemblies that are characterized by different effective emissivities (or equivalently, different effective reflectivities). The temperatures measured by these probes can then be used to obtain an initial correction for localized temperature measurements. A refined temperature correction for each localized temperature reading can then be obtained by adjusting the initial correction by an emissivity sensitivity factor derived for each localized temperature region.

Figure 3C:
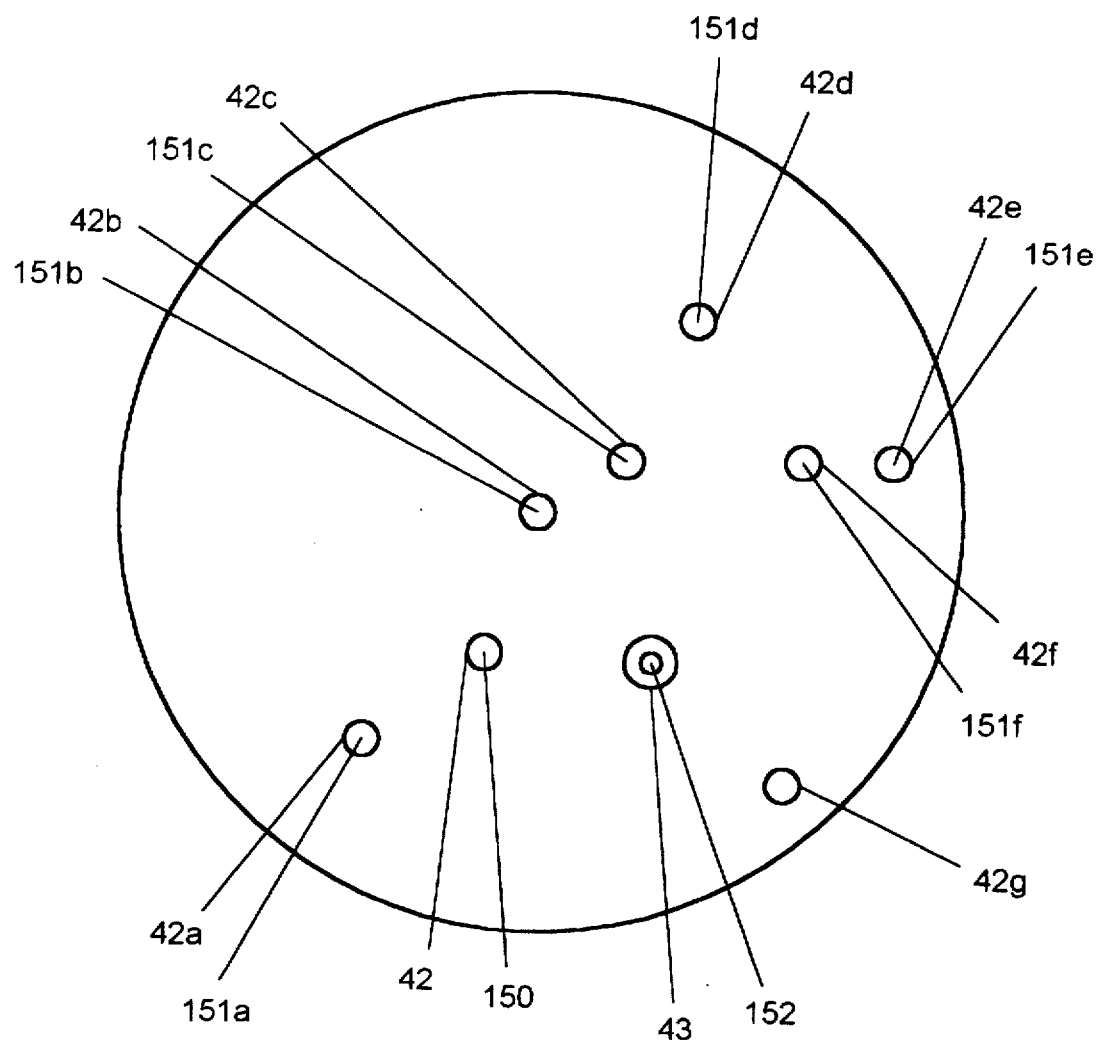
FIG. 3C is a cross-sectional view along line 3C—3C of FIG. 3A illustrating the reflector.

Referring to FIGS. 3A and 3C, two radiation probes 150, 152 having different effective emissivities $\epsilon_1$, $\epsilon_2$ are used to derive the initial temperature correction referred to above. A first probe 150 is located inside a cylindrical surface microcavity 42, as previously described and as shown more clearly in FIGS. 4A–4D. A second probe 152 is disposed in a cylindrical microcavity 43 which has its bottom covered with a non-reflecting material. The second probe 152 may be held in place by a silicon donut (not shown). The effective emissivity of the first probe $\epsilon_1$ is higher than that of the second probe $\epsilon_2$. In one embodiment, microcavity 42 for first probe 150 is approximately the same diameter as first probe 150, while the diameter of microcavity 43 associated with second probe 152 is oversized, much larger than the diameter of second probe 152. The oversized microcavity helps to isolate second probe 152 from reflector 102, providing a lower effective emissivity for second probe 152. In one embodiment, the diameter of microcavity 43 is two times the diameter of microcavity 42.

In the configuration just described, the effective emissivity for the first probe (i.e., probe 150) will be larger than the effective emissivity for the second probe (i.e., probe 152). As an alternative to placing probe 152 in a microcavity having a non-reflective coating, it may be placed above the reflector surface to within about 3–4 millimeters of the backside of substrate 106. The second probe (i.e. probe 152), however, should not be placed too close to the backside of the substrate (and away from the cooled reflecting plate) so as to avoid it being heated up by the radiation from the hot substrate during processing. If the probe is allowed to get too hot it can damage the probe and/or material may deposit on the probe, thereby degrading its performance. In addition, having the probe too close to the backside of the substrate may impact the temperature of the substrate. Other combinations of geometries are also possible so long as the two probes yield different effective emissivities. As will become apparent later, it is preferable that the two selected probe geometries produce a difference in associated effective emissivities that is maximized.

In the described embodiment, probes 150, 152 are spaced-apart by sufficient distance so that the hole, microcavity 43, producing the lower effective emissivity does not interfere with or degrade the effective reflectivity of the other probe. However, the two probes should not be spaced so far apart that they do not measure the temperature of roughly the same region of the substrate. For the described embodiment, a typical separation which appears to meet these requirements is between 1 to 3 cm. If the substrate rotates, this means that the radii at which the two probes are located should differ by no more than this amount.

In addition to the two radiation probes 150, 152, a plurality of other temperature probes (only one of which is shown in FIG. 3A for the sake of clarity) (i.e., probes 151a–151f as shown in FIG. 3C) are located inside a plurality of cylindrical surface microcavities 42a–42f of the type described and shown in FIGS. 4A–4D. In one embodiment, one or more microcavities (e.g., microcavity 42g) may be included in reflector 102 to allow for variations in the placement of one or more of probes 151a–151f depending on the process requirements. The effective emissivity for each of the other probes (i.e., probes 151a–151f) will be larger than the effective emissivity for the second probe (i.e., probe 152) and approximately equal to the emissivity of the first probe (i.e., probe 150).

In the described embodiment, probes 151a–151f, 152 may be spaced apart by a sufficient distance so that the hole, microcavity 43, for creating the lower effective emissivity for probe 152 does not interfere with or degrade the effective reflectivity of any of the other probes 151a–151f. In addition, each of the other probes (i.e., probes 151a–151f) may be spaced about reflector 102, each measuring a localized temperature. In one embodiment, a total of six other temperature probes (i.e. probe 151a–151f) are spaced about reflector 102, as is shown in FIG. 3C. Other distribution patterns for the probes 150, 151a–151f and 152 may be used depending on process requirements.

Calibration

Figure 5A:
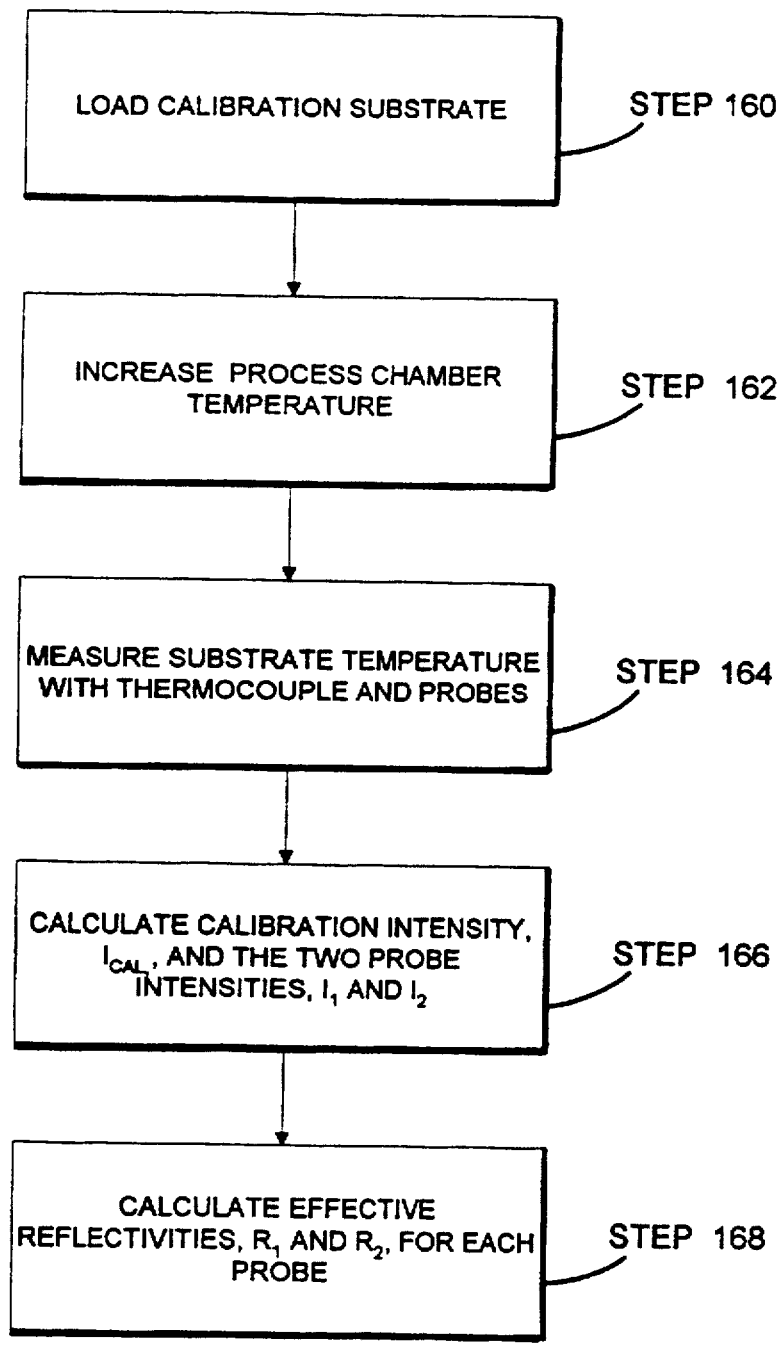
FIGS. 5A–5B are flow diagrams of a scheme for calibrating an RTP chamber for in situ temperature correction.

To perform the temperature correction for each localized temperature probe, all the probes must first be calibrated. That is, the effective reflectivity for each probe must first be determined. This is done with the aid of a series of special calibration substrates and by using the procedures outlined in FIGS. 5A and 5B.

A first calibration substrate is a standard substrate having a known, previously measured, emissivity, $\epsilon_{cal-1}$, and having a thermocouple embedded in it. The emissivity of the first calibration substrate is preferably low, about 0.3. The actual substrate temperature can be accurately measured with the thermocouple and then be compared to the temperatures reported by the pyrometers. Such substrates are commercially available from several companies, including, for example, SensArray of Santa Clara, Calif. U.S.A. Preferably, the first calibration substrate is selected to have substantially the same thermal properties as the type of substrates that are to be processed in the RTP chamber. For example, the calibration substrate should at least be made of the same material as the process substrates (e.g. silicon) and it should have the same type of backside as do the process substrates (e.g. a diffuse, lapped surface).

A determination of the effective reflectivities for probes 150 and 152 is made, and thereafter the particular sensitivity to emissivity for each of the other probe locations for the given process will be determined. To determine the effective reflectivity associated with each of probes 150, 152 ($R_{e1}$, $R_{e2}$), the first calibration substrate is loaded into the process chamber (step 160) and the temperature of the processing chamber is increased to a predetermined setting (step 162). When the desired temperature has been reached, the temperature of the substrate is measured by using the embedded thermocouple and each of the two probes 150, 152 (step 164), thereby producing three separate temperature measurements, $T_{real}$ (the actual temperature of the substrate), $T_1$ (the temperature as measured by the first probe), and $T_2$ (the temperature as measured by the second probe).

These temperatures are converted to intensities, $I_{cal}$, $I_1$ and $I_2$ (step 166). $I_{cal}$ is the intensity that a probe would receive if the cavity was actually an ideal blackbody cavity. It is computed using Eq. 1 from the temperature measured by the thermocouple, $T_{real}$, as follows:

$$I_{cal}(\lambda) = \frac{2C_1}{\lambda^5 \left(e^{\frac{C_2}{\lambda T_{real}}} - 1\right)}. \tag{9}$$

The temperatures that are recorded by pyrometers, $T_1$ and $T_2$, are converted back to the corresponding intensities ($I_1$, $I_2$) in a similar manner:

$$I_{1,2}(\lambda) = \frac{2C_1}{\lambda^5 \left(e^{\frac{C_2}{\lambda T_{1,2}}} - 1\right)}. \tag{10}$$

The effective emissivities for probes 150, 152 are equal to:

$$\epsilon_{1,2} = \frac{I_{1,2}}{I_{cal}}. \tag{11}$$

With the intensities $I_{cal}$, $I_1$ and $I_2$ known, the effective reflectivities for each of the first two probes can then be computed. From Eq. 6, the effective reflectivity can be written as a function of the actual emissivity and effective emissivity, as follows:

$$R_{1,2} = \frac{1 - \frac{\epsilon_{cal}}{\epsilon_{1,2}}}{1 - \epsilon_{cal}}. \tag{12}$$

Since the effective emissivities can be expressed in terms of the measured intensities (see Eq. 11), this equation can be rewritten as:

$$R_{1,2} = \frac{1 - \frac{\epsilon_{cal} I_{cal}}{I_{1,2}}}{1 - \epsilon_{cal}}. \tag{13}$$

Using this expression, the values for the effective reflectivities, $R_1$ and $R_2$, are computed (step 168).

These effective reflectivity values will be used later during the processing of actual substrates to determine the in situ temperature correction as described below. It should be understood, however, that the computed effective reflectivities are valid only for the particular processing system for which the calibrations was performed. If, for example, the probe geometries are altered or the system geometry is changed, it will be necessary to recalibrate the system in the manner just described to determine new values for the effective reflectivities.

Figure 5B:
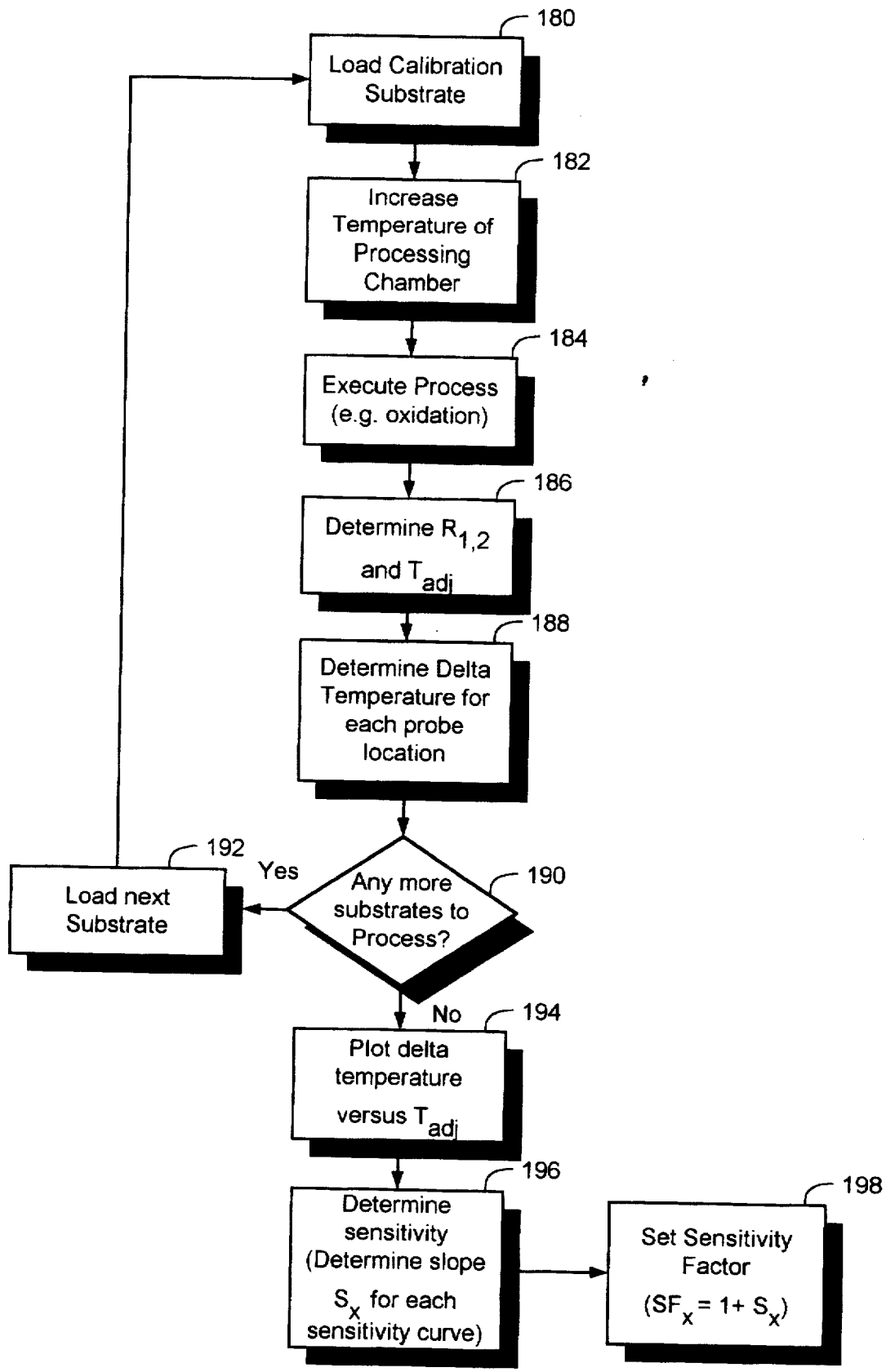

Referring now to FIG. 5B, a method of deriving emissivity sensitivity data for various localized regions of a substrate for a given process is shown. Specifically, a series of calibration substrates are processed to characterize the relative sensitivity to emissivity for each of the remaining probes (i.e., probes 151a–151f) in the temperature measurement system. In one embodiment three standard substrates having a known, previously measured, emissivity, $\epsilon_{calH}$, $\epsilon_{calM}$ and $\epsilon_{calL}$, one exhibiting a high level of emissivity (i.e., about 0.9), a second exhibiting a mid level of emissivity (i.e., about 0.7) and third exhibiting a low level of emissivity (i.e., about 0.3), are processed. Such substrates can be fabricated with standardized semiconductor fabrication techniques.

Preferably, the calibration substrates are selected to have substantially the same thermal properties as the type of substrates that are to be processed in the RTP chamber. For example, the calibration substrates should at least be made of the same material as the process substrates (e.g. silicon) and should have the same type of backside as do the process substrates (e.g. a diffuse, lapped surface).

As was indicated above, the process implemented by the RTP tool may have an impact on the effective emissivity of the substrates processed therein. In order to reduce the impact of process variations on the effective emissivity exhibited by the substrate, the process selected for this portion of the calibration procedure may be the same process to be used by the RTP tool in the subsequent processing of substrates. One example of a process is an oxidation process for silicon substrates. For the purposes of clarity, a single process will be described herein. However, other processes such as annealing and nitridation may be used.

In the oxidation process, the substrate is heated in an oxygen rich environment resulting in the formation of a layer of silicon dioxide on the surface of the substrate. In a typical operation, the substrate is heated to 1050° C. for approximately 60 seconds. The substrate is exposed to a 100% oxygen environment resulting in the formation of approximately a 75 Å thick layer of silicon dioxide on the surface of the substrate. In general, the oxidation process has a temperature sensitivity of approximately 0.8 Å per °C. at or near 1050° C. By temperature sensitivity, we mean as the temperature for a given localized region differs from the ideal temperature of 1050° C., the thickness of the oxidation layer at that location will be decreased (or increased if the temperature is higher) by the associated temperature sensitivity factor for each degree of difference (which is approximately 0.8 Å per °C. for this process).

For the oxidation process, a silicon substrate having a bare upper surface and a backside (proximal to reflector 102) coated with an approximately 1280 Å thick layer of nitride may be used for the substrate exhibiting a high level of emissivity (approximately 0.9). For the substrate exhibiting a mid level of emissivity (approximately 0.7), a silicon substrate having a bare upper surface and a bare backside (proximal to reflector 102) may be used. For the substrate exhibiting a low level of emissivity (approximately 0.3), a silicon substrate having a bare upper surface and a backside (proximal to reflector 102) coated with approximately 570 Å thick layer of polysilicon over approximately a 1700 Å thick oxide layer may be used.

The second calibration substrate having an emissivity of $\epsilon_{calH}$ is loaded into the process chamber (step 180) and the temperature of the processing chamber is increased at approximately 50° C. per second to reach the desired temperature of approximately 1050° C. (step 182). The substrate is exposed to an approximately 100% oxygen environment at the desired temperature for approximately 60 seconds, resulting in the growth of a silicon dioxide layer on the surface of the substrate (step 184). When the desired temperature has been reached, a temperature measurement of the substrate using each of the probes 150 and 152 is performed, thereby producing two or more separate temperature measurements: $T_1$ (the temperature as measured by the first probe) and $T_2$ (the temperature as measured by a second probe).

A determination of the effective reflectivities for probes 150 and 152 ($R_{e1}$, $R_{e2}$) is made for each of the calibration substrate as described previously (step 186). These effective reflectivities will be used in calculating a corrected temperature for the calibration substrate.

After oxidation process of the calibration substrate is complete, an analysis of the actual temperature applied to the substrate is determined at each of the localized regions associated with a temperature probe (i.e., probes 151a–151f) (step 188). In one embodiment, this may be accomplished by determining the thickness of the oxidation layer (silicon dioxide) at each of the localized regions associated with a temperature probes 151a–151f.

Apparatus for determining the thickness of an oxidation level on a substrate are known in the art. One example of an apparatus for performing such a task is a model number FEIII ellipsometer, manufactured by Rudolph in Flanders, N.J. The FEIII has an accuracy to about 0.1 Å.

The thickness of the silicon dioxide layer at each region associated with a temperature probe (i.e., probes 151a–151h) is determined. The actual temperature applied to a given localized region can be determined based on the thickness of the silicon dioxide layer and temperature sensitivity for the given process.

Figure 5C:
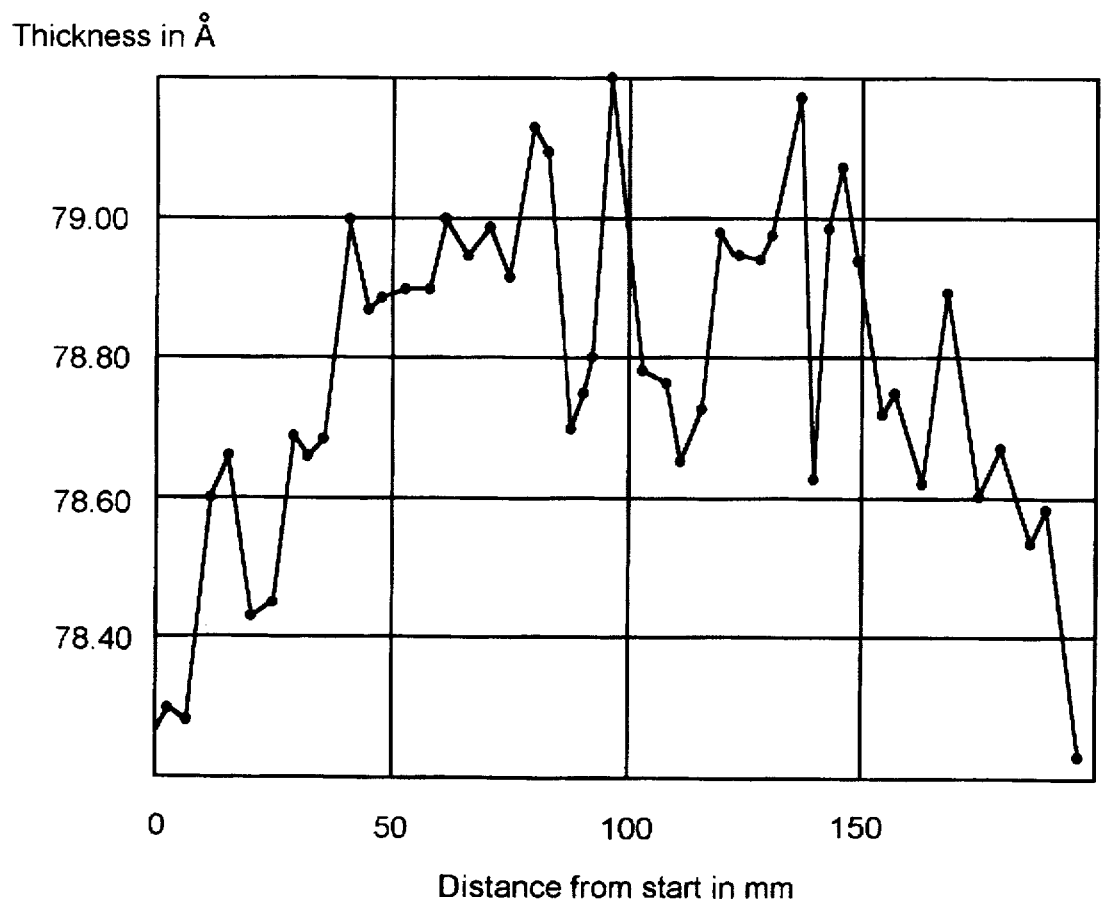
FIG. 5C is a plot derived from a post processing analysis of a substrate by an ellipsometer.
Figure 5D:
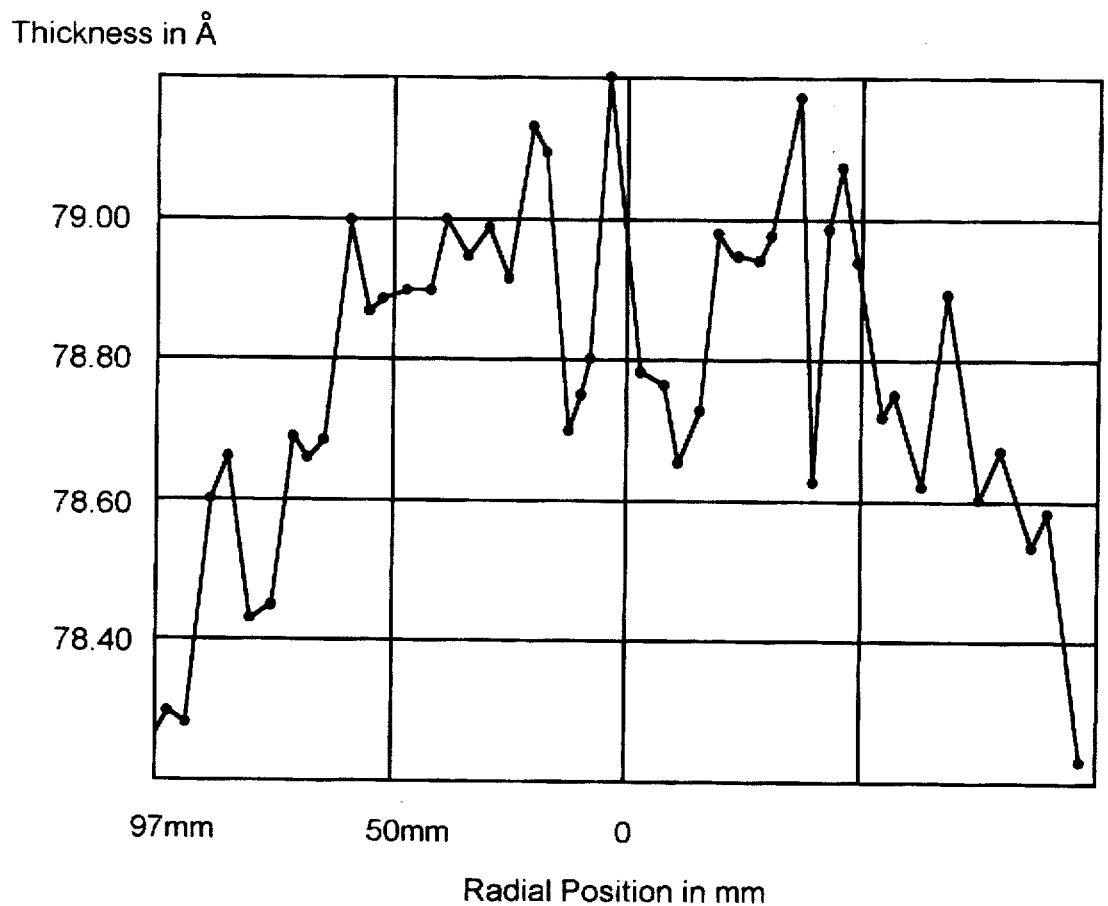
FIG. 5D is a plot of the average thickness of an oxide layer deposited on the surface of a calibration substrate during a calibration process in accordance with the present invention.

In one embodiment, the ellipsometer performs a 49 point scan across the diameter of the substrate resulting in 49 data points associated with the thickness of the silicon dioxide layer deposited on the surface of the second calibration substrate. For a 200 mm diameter substrate, the 49 point scan will result in approximately a 4 mm spacing between measurements, assuming a 3 mm exclusion region at the periphery of the substrate. In a 49 point scan, 24 measurements are made in a linear fashion starting at one edge of the substrate traveling toward the center of the substrate taking a measurement approximately every 4 mm, with the 25th measurement approximately at the center of the substrate. The remaining 24 measurements are made in a linear fashion traveling away from the center of the substrate every 4 mm until the last measurement is completed. A graph of the thickness of the oxide layer versus position on the substrate as produced by the ellipsometer is shown in FIG. 5C. Accordingly, two measurements for each radial position are recorded. The average of the two readings for each radial position is determined and then plotted on a graph as shown in Fig. 5D.

The 24 average thickness data points are plotted on a graph (FIG. 5D) with the x-component equal to the radial position of the respective measurement, and the y-component equal to the thickness measured at that radial position. The thickness (W) of the silicon dioxide layer at each localized temperature probe (i.e. probes 151a–151f) is determined by locating the radius of the temperature probe relative to the center of the substrate on the graph (i.e. $W_{a-f}$ where the subscript refers to an associated temperature probe 151a–151f). The average thickness (Wavg) across the entire substrate is determined, and thereafter a delta thickness ($W_{\Delta a-f}$ where the subscript refers to an associated temperature probe 151a–151f) between the average thickness and the measured thickness at each probe is determined.

The delta thickness data for each probe location ($W_{\Delta a-f}$) is converted to a delta temperature ($T_{\Delta a-f}$) where the subscript refers to an associated temperature probe 151a–151f) using the temperature sensitivity for the process (e.g., 0.8 Å per °C.). Specifically, the delta temperature ($T_{\Delta a\text{-}f}$) is calculated by dividing the delta thickness ($W_{\Delta a\text{-}f}$) by the sensitivity for the process. For example, if the delta thickness ($W_{\Delta a}$) at probe 151a was 8 Å, then the delta temperature ($T_{\Delta a}$) associated with the probe would be approximately 10° C.

The delta temperature data ($T_{\Delta a\text{-}f}$) at each probe location (i.e., probes 151a–151f) may be calculated in a similar fashion, resulting in delta temperature data for each probe location for the second calibration substrate.

Each of the remaining calibration substrates are processed in a similar fashion to derive delta temperature data for each probe location (Steps 190 and 192). The resultant delta temperature data is plotted on the sensitivity plots.

Figure 5E:
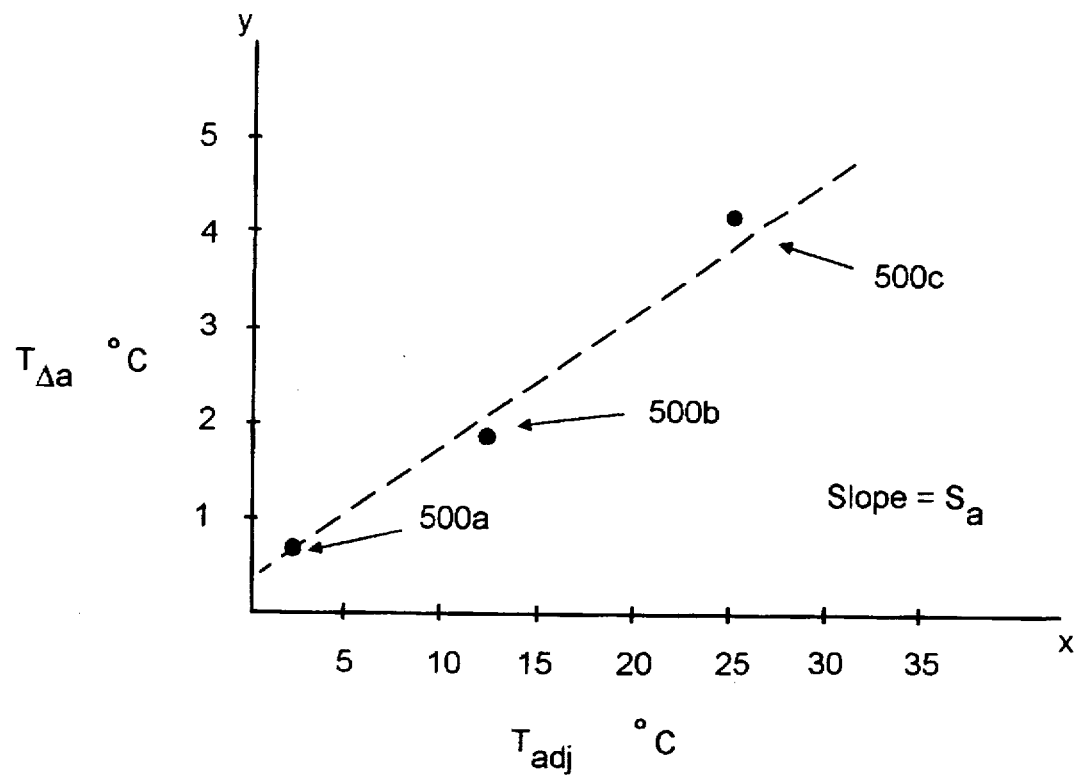
FIG. 5E is a plot of a sensitivity curve for a temperature probe for use in determining the sensitivity factor (SF)

A sensitivity plot (i.e. an individual plot associated with each of probes 151a–151f respectively) is made for each temperature probe location, an example of which is shown in FIG. 5E. For each sensitivity plot, the delta temperature data ($T_{\Delta a\text{-}f}$) for a respective temperature probe is plotted on the y-axis against the adjustment temperature ($T_{adj}$) associated with the respective calibration substrate on the x-axis as shown in FIG. 5E (step 190). The determination of the adjustment temperature ($T_{adj}$) will be described in greater detail below in association with the in situ temperature measurement process and Eqs. 18b and 18c below. A single data point, generally indicated at 500a, is plotted on the respective sensitivity plot for each probe for each calibration substrate processed. In one embodiment where three calibration substrates of varying emissivities are used, three data points (generally indicated at 500a, 500b and 500c on FIG. 5E) will be entered on the sensitivity plot. A sensitivity curve associated with data points on each sensitivity plot is then defined.

In one embodiment, the sensitivity curve is characterized in a straight line approximation as having a slope $S_{a\text{-}f}$ (where the subscript indicates the sensitivity factor of the associated probe 151a–151f), indicative of the sensitivity of the probe at this particular location to variations in emissivity (as indicated by the delta temperature data) (step 196). Alternatively, other approximation schemes including more complex polynomial functions may be used.

The effects that account for the error in the temperature measurements are energy-related effects, which introduce an exponential term. Thus, the actual errors are nonlinear. Nevertheless, the linear approximation to the error works very well in compensating for these nonlinear effects.

Of course, further optimization of the sensitivity factor can be obtained by taking into account the nonlinear way in which the temperature delta varies as a function of the adjusted temperature in the calibration substrates. In many applications, however, the substantial level of improvement that is obtained from the simple linear approximation makes further refinement of the sensitivity measurement unnecessary.

In the straight line approximation embodiment, the slope of the sensitivity curve is incremented by one, resulting in a sensitivity factor ($SF_{a\text{-}f}$ where the subscript a–f refers to the particular probe 151a–151f) for the given probe location (step 198). The sensitivity factors for all probe locations (i.e., probes 151a–151f) may be stored as a vector for use in determining the refined temperature correction ($T_{ref}$) for each localized temperature measurement as part of the in situ temperature measurement process.

Note that this calibration procedure has established a $\epsilon_{\mathit{eff}}(\epsilon, R_{\mathit{eff}})$ curve (see FIG. 2) which characterizes the first measurement probe in the system. From the in situ temperature measurements that are obtained during the processing of a substrate, it will be possible to determine the actual emissivity for that substrate. By knowing the actual emissivity, the $\epsilon_{\mathit{eff}}(\epsilon, R_{\mathit{eff}})$ curve, one can then compute the effective emissivity for the substrate and from that a corrected temperature $T_{corr_{150}}$ (the corrected temperature associated with probe 150 as described below in conjunction with Eq. 18a) for a given substrate. Thereafter by using the sensitivity factor $SF_{a\text{-}f}$ derived as part of the calibration procedure for each probe location, a refined temperature correction for a given localized region of the substrate may be determined. The details of the procedure for arriving at the corrected temperature are as follows:

In Situ Temperature Correction

Usually the probe with the highest effective reflectivity, e.g., first probe 150, is selected to make the temperature measurements; the second probe (152) serves as the correction probe.

Before describing the procedure for correcting the temperature readings of the first measurement probe, an expression for the actual emissivity of the substrate will be derived. Recall that the effective emissivities for each probe are proportional to the corresponding radiation intensities, $I_1$ and $I_2$, as indicated in Eq. 11. Thus, the ratio of the effective emissivities is equal to the ratio of the corresponding radiation intensities, i.e.,:

$$\frac{\epsilon_1}{\epsilon_2} = \frac{I_1}{I_2} . \tag{14}$$

For each probe, the effective emissivity can be expressed as a function of the actual emissivity and the corresponding effective reflectivity (from Eq. 6), i.e.,:

$$\epsilon_{1,2} = \frac{\epsilon}{1 - R_{1,2} \cdot (1 - \epsilon)} \tag{15}$$

By substituting the expressions for the effective emissivities into the above equation, the actual emissivity can be expressed in terms of the effective reflectivities and the measured intensities, as follows:

$$\epsilon = 1 - \frac{1 - \left(\frac{I_2}{I_1}\right)}{R_1 - R_2 \cdot \left(\frac{I_2}{I_1}\right)} . \tag{16}$$

Having derived this expression we are now ready to describe the procedure for correcting the temperature measurements.

Referring to FIG. 6, at the start of an RTP run, a substrate is loaded into the processing chamber (step 170) and the temperature is cycled through a predetermined temperature sequence (which may be a calibration substrate or other post calibration substrate desired to be processed). While the substrate is being sequenced through the temperature sequence, the probes 150, 152 sample the radiation near a localized region of the substrate at a predetermined sampling rate (e.g., 20 Hz) (step 172). From the measured temperatures for each probe, the corresponding probe radiation intensities, $I_1$ and $I_2$, are calculated with the aid of Eq. 10. Then, the actual substrate emissivity, $\epsilon$, is computed from Eq. 16, using the previously computed values for the effective reflectivity for each probe (step 174) Once the actual substrate emissivity is known, the effective emissivity $\epsilon_1$ for the base probe 150 is computed from Eq. 15 as follows:

$$\epsilon_1 = \frac{\epsilon}{1 - R_1 \cdot (1 - \epsilon)} \quad (17)$$

Finally, a corrected temperature ($T_{corr_{150}}$) is calculated from the temperature measured by probe 150 by using the following equation derived from Eqs. 2 and 3 (step 176):

$$T_{corr_{150}} = \frac{C_2}{\log\left[\frac{K \cdot \epsilon_1}{T_1}\right]} \quad (18\text{ a})$$

The corrected temperature data $T_{corr_{150}}$ is the sum of the measured temperature $T_{meas_{150}}$ (measured temperature at probe 150) and an adjustment temperature ($T_{adj}$) as follows:

$$T_{corr_{150}} = T_{adj} + T_{meas_{150}} \quad (18b)$$

The adjustment temperature ($T_{adj}$) is used in three ways, one for the calibration and two for the real time processing of substrates. During the calibration process, adjustment temperatures are calculated for each of the second, third and fourth calibration substrates. The adjustment temperatures are plotted against the delta temperatures derived for each temperature probe location (i.e., probes 151a–151f) to determine the sensitivity factor $SF_{a-f}$ for each probe location.

During the real time processing of substrates, the adjustment temperature associated with the substrate which is being processed is used to correct the temperature measurement of the first probe 150 according to Equation 18b. In addition, the adjustment temperature is refined by the sensitivity factor for a particular probe location to determine the refined corrected temperature $T_{ref_{a-f}}$ (where the subscript denotes a particular probe 151a–151f) associated with a particular location during the real time processing of a substrate. The use of the refined corrected temperature data and corrected temperature data will be described in further detail below in conjunction with FIG. 12.

In real time, the adjustment temperature $T_{adj}$ is refined for each temperature probe by compensating for the sensitivity factor $SF_{a-f}$. The refined temperature correction is defined as the temperature at a particular probe location which includes a correction based on the emissivity sensitivity associated with the particular probe location. The refined temperature correction $T_{ref_f}$ is calculated for each temperature sensor location as follows:

$$\begin{bmatrix} T_{corr_a} \\ \cdot \\ \cdot \\ \cdot \\ T_{corr_f} \end{bmatrix} = T_{adj} \begin{bmatrix} SF_a \\ \cdot \\ \cdot \\ \cdot \\ SF_f \end{bmatrix} + \begin{bmatrix} T_{meas_a} \\ \cdot \\ \cdot \\ \cdot \\ T_{meas_f} \end{bmatrix} \quad (18\text{ c})$$

where $T_{meas_{a-f}}$ is the measured temperature in real time associated with probes 151a–151f.

This algorithm is preferably implemented in software in controller 300 (FIG. 12) so that the temperature measurements of the probes are automatically corrected before any control decisions are made.

Figure 5F:
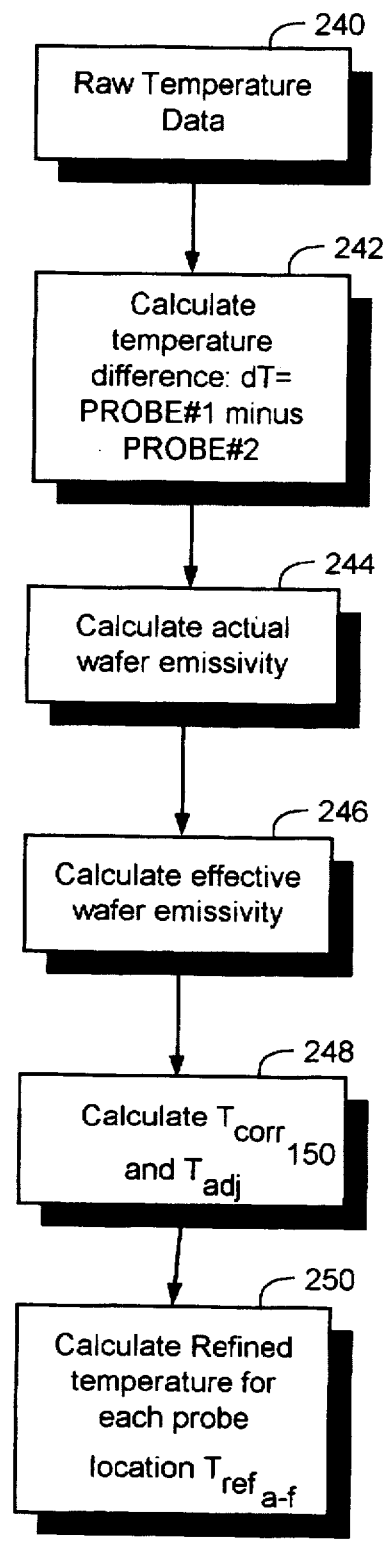
FIG. 5F is a simplified flow diagram of the process for determining a refined temperature for real time operations of the RTP tool in accordance with the present invention.

FIG. 5F is a simplified flow diagram of the process for determining the refined temperature for any of the probes 151a–151f. The corrected temperature data is used to control the heating elements as will be described in further detail below in conjunction with FIG. 12. The raw temperature data is received by controller 300 (step 240). The temperature difference between the first probe (i.e. probe 150) and the second probe (i.e. probe 152) is determined (step 242). The actual wafer emissivity is calculated as described above in conjunction with Eq. 16 (step 244). The effective emissivity is then determined as described above in conjunction with Eq. 17 (step 246). The corrected temperature and adjustment temperature are then calculated (step 248). Finally, the adjustment temperature is multiplied by the sensitivity factor for a given probe and added to the measured probe temperature to yield the refined temperature measurement (step 250).

An Alternative Emissivity Correction Technique

An alternative and somewhat simpler technique exists for calibrating the system without needing to use a calibration wafer that has an embedded thermocouple. The alternative technique requires two wafers for which the emissivity of the backside is accurately known. One wafer has an emissivity, $\epsilon_{hi}$, that is close to one, and the other wafer has a lower emissivity, $\epsilon_{low}$. In the described embodiment, the high emissivity wafer is a nitride wafer having an emissivity of 0.94 and the low emissivity wafer is a polysilicon wafer with an oxide layer having an emissivity of 0.32 on the backside of the wafer, i.e., the side facing the temperature probes.

As before, two neighboring temperature probes are used. One probe, referred to hereinafter as the small hole probe, yields a high effective reflectivity. The small hole probe produces a temperature reading $T_1$ and it is used to measure the temperature of the wafer during processing. It is the temperature that is generated by this probe (i.e., $T_1$) that will be corrected to account for the emissivity of the backside of the wafer. The other probe, referred to hereinafter as the big hole probe, yields a lower effective reflectivity. The big hole probe produces a temperature reading of $T_2$ and it is used to generate the correction that will be applied to the temperature that is measured by the small hole probe.

It is desirable that the two probes be close enough to each other so that they sample the same region of the wafer at about the same time. On the other hand, if the probes are too close, the large hole probe will impact the temperature measurement of the small hole probe for low emissivity wafers. This may lead to temperature nonuniformity on the wafers with low emissivity.

In the described embodiment, the two probes are located at the same radius from the wafer center and are separated by about 0.85 inch. The small hole probe has a configuration that is used for all of the other measurement probes in the reflecting plate. For purposes of the following example, the small hole probe uses a light pipe which has a diameter of about 0.080 inch, which is positioned in a 0.085 inch diameter hole in the reflecting plate, and which has its uppermost end flush with the surface of the reflecting plate. The big hole probe also uses a 0.080 inch diameter light pipe with its uppermost end flush with the surface of the reflecting plate but positioned within a larger hole (i.e., 0.37 inch) in the reflecting plate. The purpose of the larger hole is to produce a lower effective probe emissivity (or equivalently, a lower effective reflectivity for the reflecting cavity) for the big hole probe as compared to the small hole probe. Thus, the two probes will yield measurably different temperatures. For example, the difference in measured temperature using these two probes will be about 40°–50° C. for a wafer having a backside emissivity of 0.34 and an actual temperature of 1000° C.

As stated earlier, it is desirable to produce a large difference in effective reflecting cavity reflectivities for the two probes so as to increase the signal to noise ratio of the different temperature measurements. Thus, it should be noted that the particular manner in which this is accomplished in the described embodiment is only meant to be illustrative of one of the many different ways of achieving that objective.

As noted earlier, the energy, I, emitted by a black body is related to temperature T by Planck's law:

$$I(\lambda, T) = K(\lambda) \cdot e^{[-\frac{C_2}{\lambda(T+273)}]}. \quad (19)$$

In this case, since T is measured in °C., 273 is added to the temperature to produce the equivalent Kelvin temperature as required in Eq. 19. By rearranging the variables, an equation for temperature as a function of measured energy, $I_E$, can be derived:

$$T_c = \frac{C_2}{\lambda \cdot \ln\left[\frac{K(\lambda)}{I_E}\right]} - 273. \quad (20)$$

In other words, with this equation the temperature of a black body can be computed by knowing the amount of energy being emitted from the object.

Calibration for Deriving $T_{corr}$

The procedure for generating a correction factor for the temperature reading of the small hole probe is shown in FIG. 7. The procedure will now be described in detail with reference to the steps shown in FIG. 7.

Initially, the high emissivity wafer is heated in the chamber to $T_{process}$ as measured using the small hole probe and the two probes are calibrated to produce the same temperature reading (step 210). Although the actual temperature readings of the two probes prior to calibration will differ, the amount by which they differ will be small when using the high emissivity wafers.

To establish two measurements that are necessary for the calibration of the small hole probe, the low emissivity wafer is then heated to temperature, $T_{process}$. To determine the process temperature of the substrate, it is again assumed that the small hole probe accurately measures the wafer temperature of the low emissivity wafer. Note that this is an assumption that proves to be acceptable, as will become apparent below. While the wafer is at $T_{process}$, its temperature is measured using both the big hole probe and the small hole probe (step 212). The big hole probe produces a measured temperature of $T_2 = T_{big}$ and the small hole probe produces a measured temperature of $T_1 = T_{small}$. A delta temperature, $\delta T(\epsilon_{low}, T_{process})$, is defined as the difference between these two readings, i.e., $\delta T(\epsilon_{low}, T_{process}) = T_1 - T_2$.

Next, the actual sensitivity of the small hole probe to differences in wafer emissivity is determined by performing an implantation anneal on each of the wafers (i.e., the low emissivity wafer and the high emissivity wafer), using the measured temperature readings produced by the small hole probe as the actual temperature. In other words, the temperature readings produced by the small hole probe are assumed to be correct temperature readings, in spite of the fact that they are slightly incorrect. However, as is well known, the film resistivity of the implanted layer will be critically dependent upon the time and the actual temperature of the implantation anneal. Furthermore, that dependency is accurately known. Thus, by measuring the resistivities of the layer on each of two wafers, each of which has been annealed at a different process temperature for the same amount of time, it will be possible to accurately determine what the actual difference between the two process temperatures was.

When the small hole probe produces temperature readings that are the same for both the low emissivity wafer and the high emissivity wafer, the actual temperature of the low emissivity wafer will, in reality, be slightly higher than the actual temperature of the high emissivity wafer. This is because at a given actual wafer temperature, the low emissivity wafer will emit less energy than will the high emissivity wafer at the same temperature. Thus, to make the energy emitted by the low emissivity wafer equal to the energy emitted by the high emissivity wafer, its actual temperature must be slightly higher than the actual temperature of the high emissivity wafer.

To determine the difference between the two actual wafer process temperatures, one implantation anneal is performed on the high emissivity wafer, using the small hole probe to monitor the process temperature. A second implantation anneal is performed on the low emissivity wafer, again using the small hole probe to monitor process temperature. Then, the film resistivities of each of the wafers is measured and, using well known conversion charts for the particular anneal that was performed, the difference in the actual process temperatures of the two wafers can be accurately determined. The result is designated as $T_{errorlow}$ (step 214).

Alternatively to performing an implantation anneal, an oxide layer can be grown on the two wafers and then the difference in oxide thickness can be determined. The difference in oxide thicknesses can then be converted, using well known tables, to an accurate measure of the difference in the actual process temperatures that produced the two oxide thicknesses.

By modeling the actual temperature error, $T_{errorlow}$, of the small hole probe as a linear function of $\delta T(\epsilon, T)$, a correction factor, $K_{corr}$ is then computed as follows (step 216):

$$K_{corr} = \frac{T_{errorlow}}{\delta T(\epsilon_{low}, T_{process})}. \quad (21)$$

For the present example, $K_{corr}$ equals 1.246.

In Situ Temperature Correction

Figure 11:
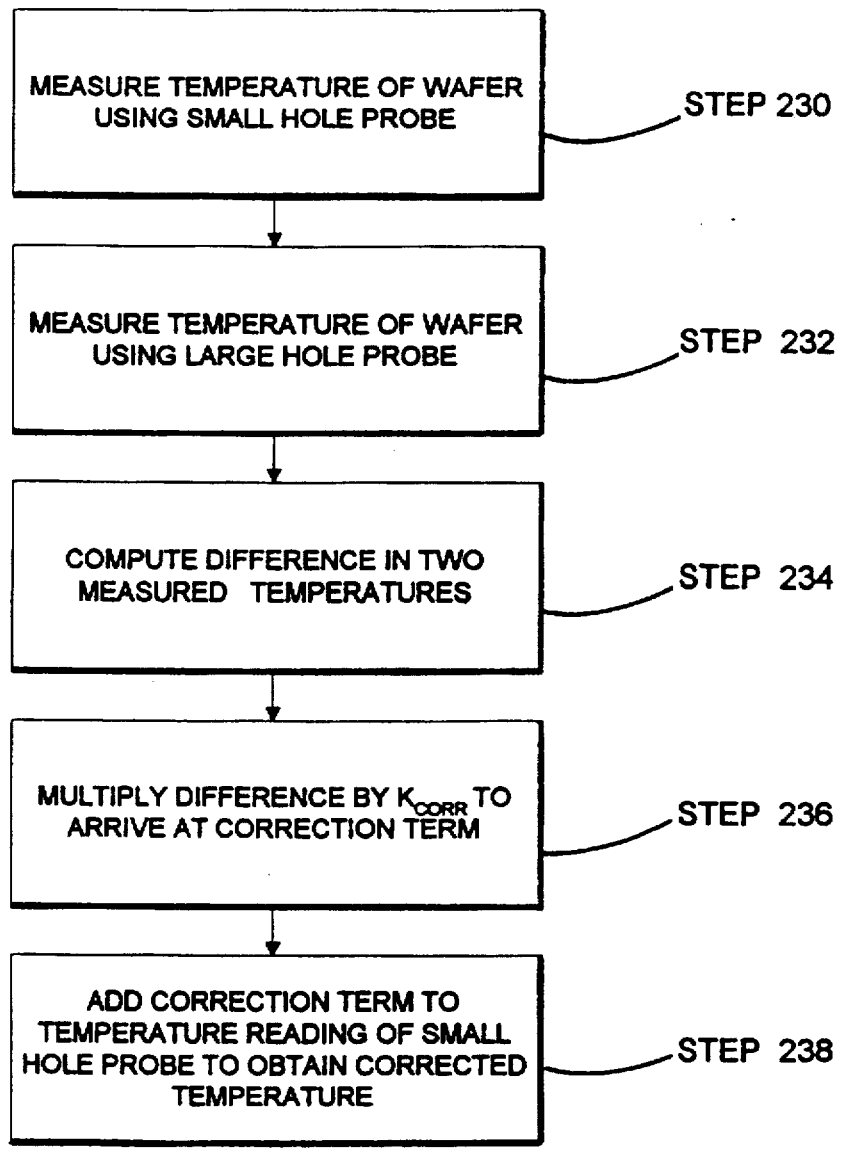
FIG. 11 shows the steps of computing a corrected temperature from a temperature measurement probe.

A corrected temperature, $T_{corr}$, is generated from the small hole probe and big hole probe temperature measurements as shown in the flow chart of FIG. 11. The wafer temperature is measured using both the small hole probe (step 230) and the big hole probe (step 232) to obtain $T_1$ and $T_2$, respectively. The difference in measured temperatures (i.e., $T_1 - T_2$) is computed (step 234) and multiplied by $K_{corr}$ (step 236) to arrive at the correction term which is then added to $T_1$ to arrive at the corrected temperature (step 238). In other words, $$T_{corr} = T_1 + K_{corr} \cdot \delta T(\epsilon, T). \quad (22)$$

The principles behind this technique and the resulting improvement in the accuracy of the temperature measurement will now be described.

In essence, the measurement of the sensitivity of the small hole probe determines which effective emissivity curve (see Eq. 15) described applies to the small hole probe. This can be seen as follows. In performing the implantation anneal on the low emissivity wafer while using the small hole probe as a monitor of the process temperature, it is assumed that the emissivity of the wafer is one. With that assumption, the energy emitted by the wafer is equal to the energy that is emitted by an ideal black body at $T_{process}$, i.e., $I(T_{process}, \lambda)$. However, the previous determination of $T_{errorlow}$ indicates that the actual temperature of the wafer is higher, namely, $T_{process} + T_{errorlow}$. Thus, the energy being emitted by the wafer can also be expressed as being equal to the effective emissivity for the low emissivity wafer (i.e. $\epsilon_{efflow}$) times the energy that would be emitted by a black body at this higher temperature (i. e., $I(T_{process} + T_{errorlow}, \lambda)$). In other words, $$\epsilon_{\textit{eff,low}} \cdot I(T_{\textit{process}} + T_{\textit{error}}, \lambda) = I(T_{\textit{process}}, \lambda). \quad (23)$$

This can be rewritten to obtain an equation for computing $\epsilon_{\textit{eff,low}}$ as follows:

$$\epsilon_{\textit{eff,low}} = \frac{I(T_{\textit{process}}, \lambda)}{I(T_{\textit{process}} + T_{\textit{error}}, \lambda)}. \quad (24)$$

For the described embodiment, $\epsilon_{\textit{eff,low}}$ is computed to be 0.855. Then, by using Eq. 17, the effective reflectivity for the small hole probe, $R_{\textit{effsmall}}$, is computed from the effective and actual emissivities of the low emissivity wafer as follows:

$$R_{\textit{effsmall}} = \frac{1 - \frac{\epsilon}{\epsilon_{\textit{eff,low}}}}{1 - \epsilon}. \quad (25)$$

In this example, $R_{\textit{effsmall}}$ is equal to 0.92.

By knowing $R_{\textit{effsmall}}$ and by using Eq. 15, we can plot the apparent emissivity for the small hole probe as a function of actual wafer emissivity. This plot is shown as the upper curve in FIG. 8.

The two temperature measurements that were obtained for the high emissivity wafer, namely, $T_{\textit{big}}$ and $T_{\textit{small}}$ enable us to determine the effective emissivity curve of the big hole probe in a similar manner. For the big hole probe, it is known that measured emitted energy, $I(T_{\textit{big}}, \lambda)$, is equal to the energy emitted by a black body at some higher temperature, $T_{\textit{actual}}$, times the effective emissivity of the big hole probe, $\epsilon_{\textit{effbig}}$. Similarly, for the small hole probe, it is known that measured emitted energy, $I(T_{\textit{small}}, \lambda)$, is equal to the energy emitted by a black body at the higher temperature, $T_{\textit{actual}}$, times the effective emissivity of the small hole probe, εeffsmall. Thus, the following expression may be written:

$$\frac{I(T_{\textit{big}}, \lambda)}{\epsilon_{\textit{effbig}}} = \frac{I(T_{\textit{small}}, \lambda)}{\epsilon_{\textit{effsmall}}} = I_{\textit{blackbody}}. \quad (26)$$

This can, in turn, be rewritten and generalized as:

$$\epsilon_{\textit{effbig}} = \epsilon_{\textit{effsmall}} \cdot \frac{I(T_2, \lambda)}{I(T_1, \lambda)}. \quad (27)$$

Since the effective reflectivity of the small hole probe is now known (see above), $\epsilon_{\textit{effsmall}}$ can be computed from the following relationship:

$$\epsilon_a = \frac{\epsilon}{1 - (1 - \epsilon) \cdot R_{\textit{eff}}}, \quad (28)$$

where $\epsilon_a$ is the apparent emissivity and $R_{\textit{eff}}$ is effective reflectivity. By using the previously computed value for $R_{\textit{effsmall}}$ and the actual emissivity for the high emissivity wafer (i.e., 0.94), a value for $\epsilon_{\textit{effsmall}}$ can be calculated:

$$\epsilon_{\textit{effsmall}} = \frac{\epsilon_{hi}}{1 - (1 - \epsilon_{hi}) \cdot R_{\textit{effsmall}}}. \quad (29)$$

Plugging the value for $\epsilon_{\textit{effsmall}}$ into Eq. 27 yields a value for $\epsilon_{\textit{effbig}}$. In the present example, the computed value is 0.749.

Using Eq. 17, a value for the effective reflectivity for the big hole probe, i.e., $R_{\textit{effbig}}$, can also be computed. In the present example, $R_{\textit{effbig}}$ is equal to 0.842.

Knowing $R_{\textit{effbig}}$ enables us to plot the apparent emissivity for the big hole probe. This plot is the lower curve in FIG. 8. Note that for purposes of the calibration schemes it is desirable to have the two curves (i.e., the apparent emissivity curves for the small hole probe and the big hole probe) separated by a large amount so as to increase the signal-to-noise ratio of the calibration.

If no correction is made to the temperature measured by the small hole probe during a process run, the temperature error, $T_{\textit{errnocorr}}$ will be equal to:

$$T_{\textit{errnocorr}} = T - T_C(I_E), \quad (30)$$

where $$I_E = \epsilon_a(\epsilon, R_{\textit{effsmall}}) \cdot I(T, \lambda). \quad (31)$$

Substituting this expression into Eq. 28 yields:

$$T_{\textit{errnocorr}} = T - T_C(\epsilon_a(\epsilon, R_{\textit{effsmall}}) \cdot I(T, \lambda)). \quad (32)$$

Figure 9:
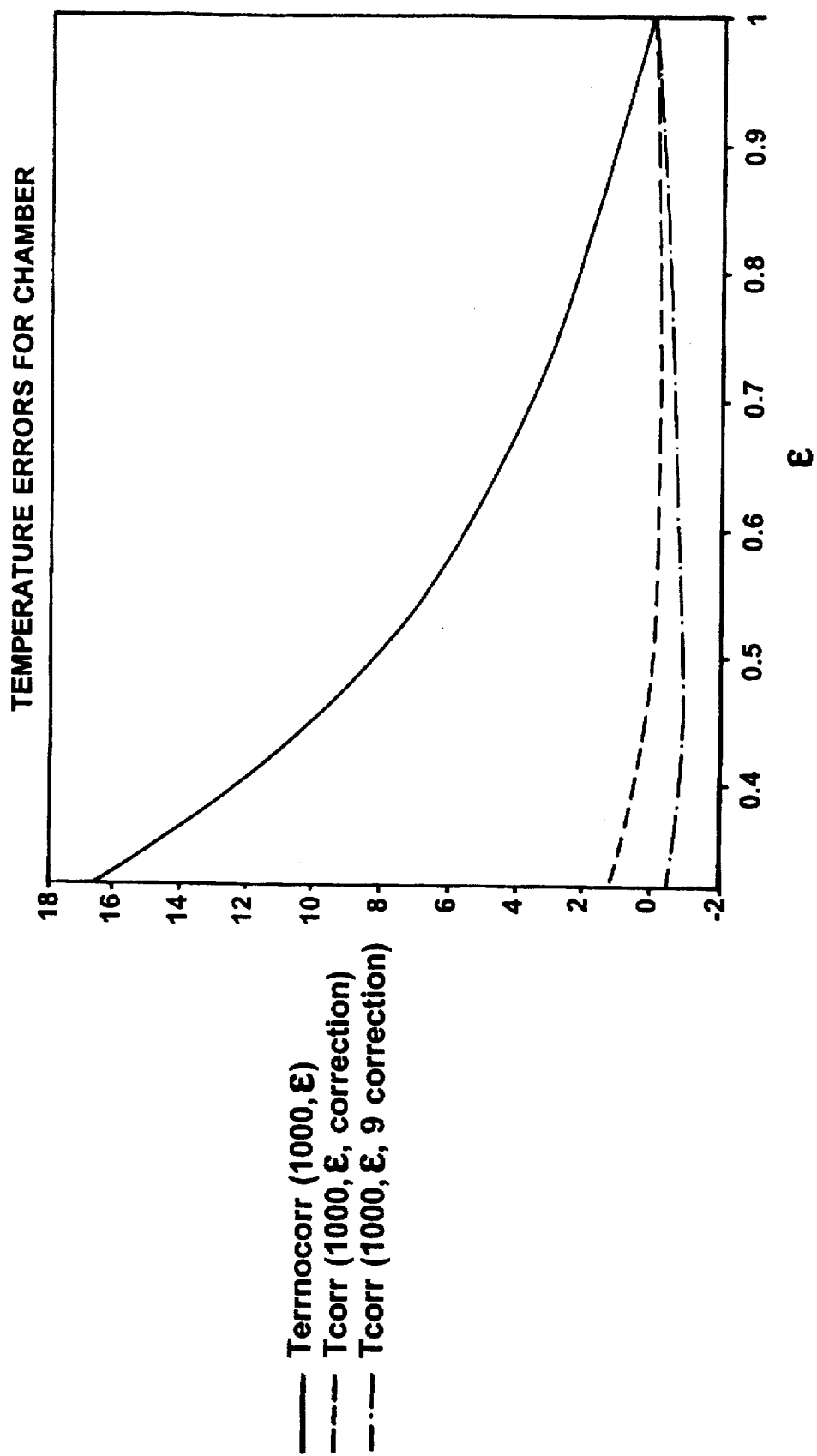
FIG. 9 shows plots of errors for the uncorrected temperature measurements and for the corrected temperature measurements, both as a function of actual wafer emissivity.

A plot of this function is shown in FIG. 9 (see upper, solid curve), which shows the error that is introduced into the uncorrected temperature measurement using the small hole probe increasing significantly with decreasing substrate emissivity.

By using Eq. 20, the difference in temperatures measured by the big hole probe and the small hole probe, i.e., $\delta T(\epsilon, T)$, can be computed as follows:

$$\delta T(\epsilon, T) = T_C(\epsilon_a(\epsilon, R_{\textit{effsmall}}) \cdot I(T, \lambda)) - T_C(\epsilon_a(\epsilon, R_{\textit{effbig}}) \cdot I(T, \lambda)) \quad (33)$$

The lower, dotted curve in FIG. 9 illustrates the improved accuracy of the corrected temperature measurement as a function of wafer backside emissivity. Note that over a range of emissivities from 0.3 to 1.0, the error is less than about 1° C. In other words, the corrected temperature reading from using the above-described technique is substantially improved and the sensitivity of the corrected temperature reading to variations in emissivity from one wafer top the next is greatly reduced as compared to the uncorrected temperature reading.

It is apparent from FIG. 9 that the linear approximation has generated a correction factor that has slightly overcompensated for the actual measurement error. One way to further optimize the correction factor is to simply use a smaller factor, e.g. 0.9 $K_{\textit{corr}}$. If the correction factor is scaled in that way, the resulting curve more closely approaches zero error over a larger portion of the emissivity range (see dashed curve in FIG. 9).

The effects that account for the error in the small hole probe temperature measurement are energy-related effects, which introduce an exponential term. Thus, the actual errors are nonlinear. Nevertheless, the linear approximation to the error works very well in compensating for these nonlinear effects.

Of course, further optimization of the correction factor can be obtained by taking into account the nonlinear way in which the correction factor varies as a function of the temperature difference between the two probes. In many applications, however, the substantial level of improvement that is obtained from the simple linear approximation makes further refinement of the corrected temperature measurement unnecessary.

Figure 10:
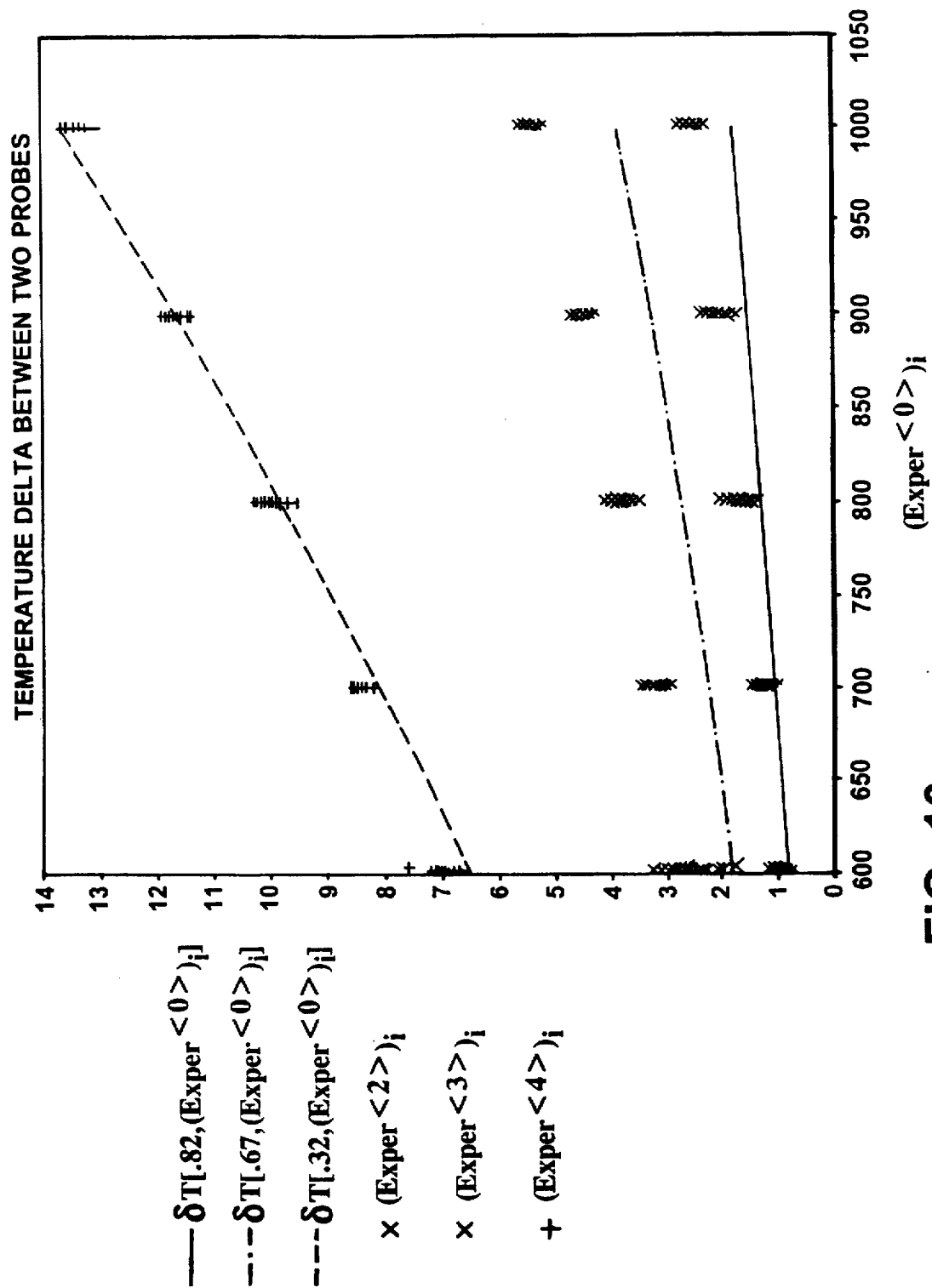
FIG. 10 shows experimental values and calculated values for the difference in temperatures measured by the small hole probe and the big hole probe.

To evaluate the accuracy of the equation for $\delta T(\epsilon, T)$ (i.e., Eq. 33), the computed values were compared to actual experimental data for the temperature difference between the two probes. This comparison is shown in FIG. 10. The top curve is for a wafer having an emissivity of 0.32, the middle curve is for a wafer having an emissivity of 0.67, and the lower curve is for a wafer having an emissivity of 0.82. The experimental data is presented as "x's" and "+'s" in the graph. To obtain the experimental data, a wafer was placed in the chamber and the temperature was ramped up to 1000° C. At every 100° C. step after 500° C., the temperature was allowed to stabilize for about 10 seconds and then a temperature reading for each of the probes was recorded. The difference between these two readings corresponds to $\delta T(\epsilon, T)$. The scatter in the data taken at each temperature is due to the noise in the measurements. FIG. 10 shows that the experimental data confirms the accuracy of the model.

It should be understood that other techniques may be used to reduce the effective reflectivity associated with the second probe. The two techniques described above involved raising the probe above the surface of the reflecting plate or enlarging the hole around the probe. Other techniques include, for example: (1) reducing the reflectivity of the reflecting plate around the probe by forming an absorbing donut around the probe (e.g. a region covered with silicon nitride); (2) reducing the reflectivity of the reflecting plate over the bandwidth of the optical pyrometer around the probe; or (3) reducing the view angle of the probe by including an aperture at the fiber output.

If a reduced viewing angle is used for the second probe, the size of the hole may be decreased while still achieving a difference in the measured temperatures using the two probes of about 40° C. Thus, using this approach, we can minimize the impact that the second probe makes on the first probe temperature measurement and this permits us to move the probes closer together.

Figure 8:
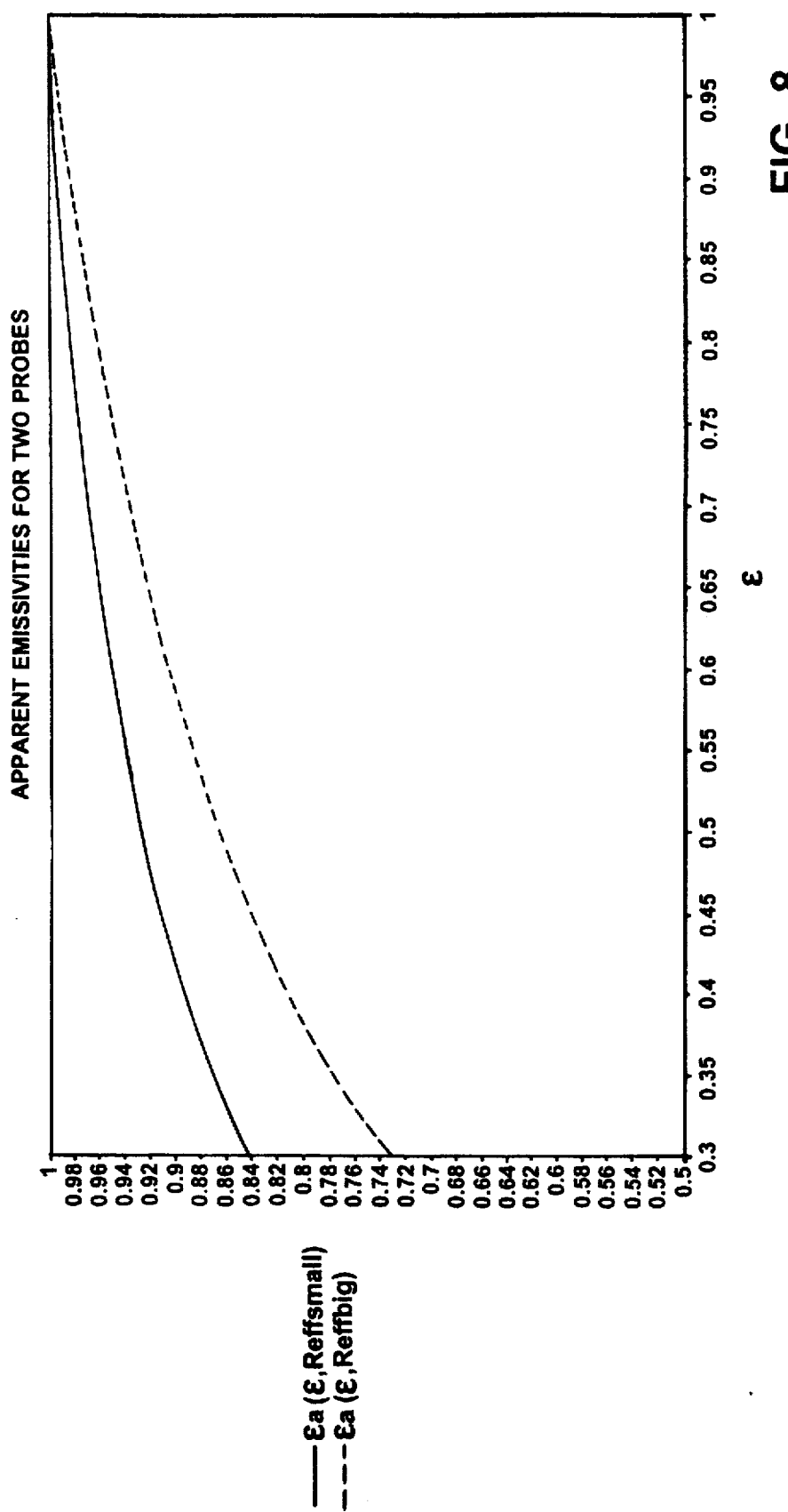
FIG. 8 shows plots of the apparent emissivity of a small hole probe and of a large hole probe, both as a function of actual wafer emissivity.

It should be noted that an alternative to performing the above-described correction techniques is redesigning the chamber so as to drive the top line in FIG. 8 higher, i.e., closer to one. But that is a much more difficult task than simply correcting for the error as described above.

Additional Details About the RTP System

As indicated above, the described embodiment can use eight measurement probes (i.e. probes 150, 151a–151f, and 152) distributed over the reflector so as to measure the temperature at different radii of the substrate, as shown in FIG. 3C. During thermal processing, support structure 108 is rotated at about 90 RPM. Thus, each probe actually samples the temperature profile of a corresponding annular ring area on the substrate. The temperature indications associated with each probe 151a–151f are corrected according to the individual sensitivity to variations in emissivity associated with the probe location as described above in connection with the in situ measurement technique.

The support structure which rotates the substrate includes a support ring 134 which contacts the substrate around the substrate's outer perimeter, thereby leaving all of the underside of the substrate exposed except for a small annular region about the outer perimeter. Support ring 134 has a radial width of approximately one inch (2.5 cm). To minimize the thermal discontinuities that will occur at the edge of substrate 106 during processing, support ring 134 is made of the same, or similar, material as the substrate, e.g. silicon or silicon carbide.

Support ring 134 rests on a rotatable tubular quartz cylinder 136 that is coated with silicon to render it opaque in the frequency range of the pyrometers. The silicon coating on the quartz cylinder acts as a baffle to block out radiation from external sources that might contaminate the intensity measurements. The bottom of the quartz cylinder is held by an annular upper bearing race 141 which rests on a plurality of ball bearings 137 that are, in turn, held within a stationary, annular, lower bearing race 139. The ball bearings 137 are made of steel and coated with silicon nitride to reduce particulate formation during operation. Upper bearing race 141 is magnetically-coupled to an actuator (not shown) which rotates cylinder 136, guard ring 134 and substrate 106 at about 90 RPM during thermal processing.

Referring to FIG. 3B, the support ring 134 is designed to create a light tight seal with the quartz cylinder 136. Extending from the bottom surface of the support ring 134 is a cylindrically shaped lip 134a which has an outside diameter that is slightly smaller than the inside diameter of the quartz cylinder, so that it fits into the cylinder, as shown, and forms a light seal. On the inside region of the support ring, there is a shelf 134b for supporting substrate 106. The shelf 134b is a region around the inside circumference of the support ring that is lower than the rest of the support ring.

A purge ring 145 that is fitted into the chamber body surrounds the quartz cylinder. Purge ring 145 has an internal annular cavity which opens up to a region above upper bearing race 141. The internal cavity 147 is connected to a gas supply (not shown) through a passageway 147. During processing, a purge gas is flowed into the chamber through purge ring 145.

Support ring 134 has an outer radius that is larger than the radius of the quartz cylinder so that it extends out beyond the quartz cylinder. The annular extension of the support ring beyond cylinder 136, in cooperation with purge ring 145 located below it, functions as a baffle which prevents stray light from entering the reflecting cavity at the backside of the substrate. To further reduce the possibility of stray light reflecting into the reflecting cavity, support ring 134 and purge ring 145 may also be coated with a material that absorbs the radiation generated by heating element 110 (e.g., a black or grey material).

As indicated above, light pipes 126 are made of sapphire. Sapphire light pipes are generally preferred because they have relatively small scattering coefficients and they tend to have greater transverse light rejection, thus they provide greater measurement localization. However, the light pipes can be made of any appropriate heat-tolerant and corrosion-resistant material, e.g., quartz, that can transmit the sampled radiation to the pyrometer. Suitable quartz fiber light pipes, sapphire crystal light pipes, and light pipe/conduit couplers may be obtained from the Luxtron Corporation-Accufiber Division, 2775 Northwestern Parkway, Santa Clara, Calif. 95051-0903. Alternatively, the radiation sampling system could be an optical system that includes a small-radius objective lens mounted in reflector 102 and a system of mirrors and lenses which communicate radiation collected by the lens to the pyrometer. Such a scheme may be less expensive than sapphire light pipes if appropriate off-the-shelf optical elements can be found. Alternatively, light pipes can also be made from a tube with a highly polished reflective inner surface.

A suitable heating element 110 is disclosed in U.S. Pat. No. 5,155,336, incorporated herein by reference. This heating element uses 187 light pipes to deliver highly collimated radiation from tungsten-halogen lamps to processing chamber 100. The lamps are divided into twelve zones which are located in a radially symmetrical manner. The zones can be individually adjusted to allow the radiative heating of different areas of substrate 106 to be controlled.

In the embodiment of FIG. 3A, base 116 includes a circulation circuit 146 through which coolant circulates, thereby cooling the reflector and the reflecting surface. Water which is typically at about 23° C. is circulated through the base 116 to keep the temperature of the reflector well below that of the heated substrate (e.g., 100° C. or less). It is important to cool the reflector during RTP to discourage any possible chemical activity that might occur on its surface 120. If the reflector is allowed to heat up, this will tend to increase surface oxidation which could seriously degrade the reflectivity of the reflecting layer. Achieving an effective emissivity enhancement depends on having and maintaining a highly reflective surface. In addition, as the reflector assembly heats up it will become a source of radiation which will contaminate the sampled signal.

In the described embodiment, pyrometer 128 has a narrow bandwidth (e.g. about 40 nm) located at about 950 nm. It may also be desirable to coat the backside of quartz window 114 with an inert material which is transparent to thermal radiation in all but this narrow band of wavelengths, thereby reducing the likelihood that the heat source will introduce stray radiation into the reflecting cavity.

In general, it is desirable in a system for processing silicon substrates to use a pyrometer that detects long radiation wavelengths (e.g. wavelengths greater than about 3.5 to 4 µm). However, this approach is best suited for temperatures above 700° C. At room temperature, a silicon wafer is transparent to wavelengths of light longer than 1.0 µm. As the temperature of the substrate increases, the substrate becomes opaque to the longer wavelengths until, at about 700° C., the substrate becomes opaque to all wavelengths of interest. Thus, at temperatures below 700° C., a long wavelength sensitive pyrometer will be more apt to also detect light coming directly from the heat source. In short, the wavelength sampled by the pyrometer should take into account the process temperature. If the process temperature is substantially below 700° C., then the pyrometer should sample wavelengths shorter than 1.1 µm. If higher process temperatures are used, then longer wavelengths can be sampled.

It should also be noted that at very low process temperatures (e.g., 600° K (327° C.), only a small amount of black body spectral radiation is generated at wavelengths shorter than 1.1 µm. As a result, at temperatures below 600° K, it becomes quite difficult to obtain a satisfactory signal-to-noise ratio.

In one design, particularly suitable for process temperatures between 900° and 1350° C., a solid-state pyrometer is used that is sensitive to radiation at wavelengths between 0.9 µm and 1.0 µm (e.g., a 900-LP-6.35 C sensor combined with a 100-S8MS-B-8CV electronics box, both of which are available from Luxtron Corporation-Accufiber Division). In this temperature range, there is substantial amount of radiation produced in the wavelength range 0.9–1.0 µm, providing high signal strengths and high signal-to-noise ratios.

Figure 12:
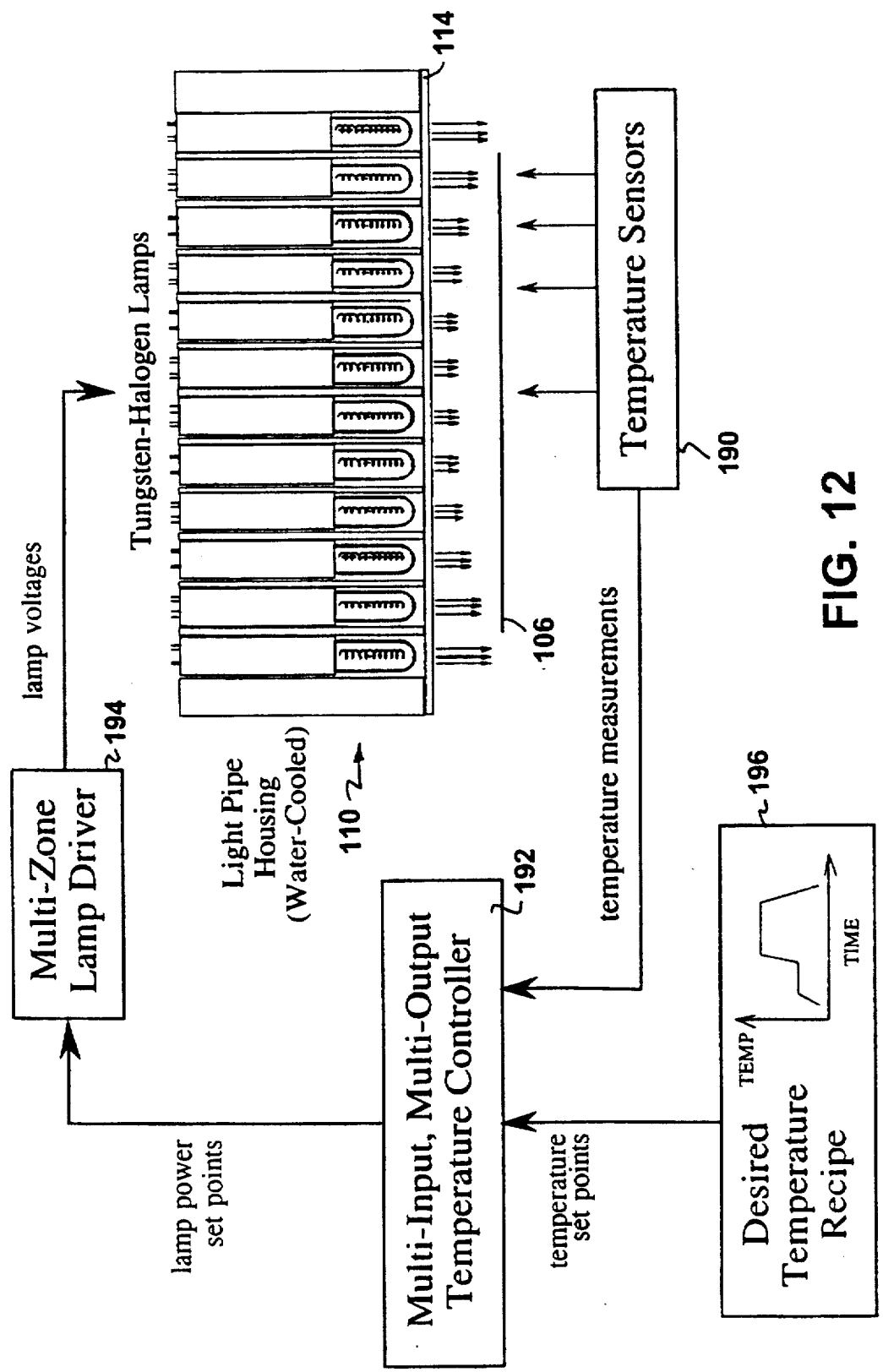
FIG. 12 is a schematic diagram of a temperature control system.

FIG. 12 shows a control loop for heating the substrate to the desired temperature. It uses the sampled output from a plurality of temperature sensors 302 (i.e., pyrometers and light pipes). The heating element 110 includes 187 tungsten-halogen lamps that are arranged in radial zones. Each zone of lamps is separately powered by a multi-zone lamp driver 194 that is, in turn, controlled by a multi-input, multi-output controller 300. Since the substrate rotates at about 90 rpm and temperature measurements are made at different radial locations on the backside of substrate 106, each temperature probe produces an average temperature over a different annular region of the substrate. The annular regions coincide with the radial zones of the heat lamp. Controller 300 receives the temperature measurements that are generated by temperature sensors 302, corrects the temperatures ($T_{refc}$) based upon the above-described refined temperature correction algorithm, and adjusts the power level of the heating lamps to achieve a substrate temperature as specified by a predefined temperature cycle profile 304 that is supplied to controller 300. Throughout the process cycle, the controller automatically adjusts the power levels delivered to the different lamp zones so that any temperature deviations away from the desired temperature profile may be corrected.

Other embodiments are within the scope of the following claims.

What is claimed is:

1. A method of correcting temperature probe readings in a thermal processing chamber for heating a substrate, said method comprising:

forming a reflecting cavity on one side of the substrate;

heating the substrate to a process temperature;

using a first probe, a second probe and at least a third probe to sample energy from said reflecting cavity, said first and third probes having associated therewith a first effective reflectivity and said second probe having associated therewith a second effective reflectivity, the sampled energy from the first probe producing a first temperature indication, the sampled energy from the second probe producing a second temperature indication and the sampled energy from the third probe producing a third temperature indication, and wherein the first and second effective reflectivities are different;

from the first and second temperature indications, deriving a corrected temperature reading for the first probe where the corrected temperature reading is the sum of the first temperature indication and an adjustment temperature, said adjustment temperature derived from a difference between said first and second temperature indications, wherein the corrected temperature reading for the first probe is a more accurate indicator of an actual temperature of the substrate in the environment of the first probe than are uncorrected readings produced by the first and second probes; and from the adjustment temperature and the third temperature indication, deriving a corrected temperature reading for the third probe, wherein the corrected temperature reading for the third probe is a more accurate indicator of an actual temperature of the substrate in the environment of the third probe than are uncorrected readings produced by the third probe.

2. The method of claim 1 further comprising using a first noncontacting probe for the first probe, using a second noncontacting probe for the second probe and using a third noncontacting probe for the third probe.

3. The method of claim 2 wherein the temperature indication that are obtained using the first, second and third probes are performed closely in time.

4. The method of claim 2 wherein the temperature indications that are obtained using the first, second and third probes are performed concurrently.

5. The method of claim 2 wherein the corrected temperature reading for the third probe is the sum of the product of the adjustment temperature multiplied by a sensitivity factor for the third probe and the third temperature indication.

6. The method of claim 2 wherein the deriving step for the third probe comprises computing a sensitivity factor for the third probe location, and where the product of said sensitivity factor and the adjustment temperature derived for the first probe is summed with the third temperature indication to yield the corrected temperature reading for the third probe.

7. The method of claim 6 wherein the sensitivity factor is computed by determining the temperature variation from an average temperature applied for a plurality of calibration substrates having predetermined emissivity levels.

8. The method of claim 7 wherein said plurality of calibration substrates includes at least one substrate having a high emissivity level, at least one having a low emissivity level and at least one having an emissivity level between the high and low levels.

9. The method of claim 8 wherein the sensitivity factor for said third probe is determined by a straight line approximation of a sensitivity curve associated with the corrected temperature data derived for the first probe and the localized temperature variation from the average temperature applied for the calibration substrates.

10. The method of claim 1 further comprising using optical pyrometers for the first, second and third probes.

11. An apparatus for measuring the temperature of a substrate in a thermal processing heating chamber, the apparatus comprising:

a reflecting plate placed next to one surface of the substrate to form a reflecting cavity therebetween;

a first probe positioned to receive energy from the reflecting cavity and produce a first temperature indication;

a second probe positioned to receive energy from the reflecting cavity and produce a second temperature indication, said first probe having associated therewith a different effective reflectivity for said cavity than said second probe;

at least one third probe positioned to receive energy from the reflecting cavity and produce a third temperature indication, said third probe having associated therewith approximately the same effective reflectivity for said cavity as said first probe; and a temperature measurement module which during processing receives the first, second and third temperature indications from said first, second and third probes, respectively, said module programmed to derive a corrected temperature reading for said first probe from said first and said second temperature indications, said corrected temperature reading for said first probe being the sum of said first temperature indication and a calculated adjustment temperature, said adjustment temperature calculated from a difference between said first and second temperature indications, said corrected temperature reading being a more accurate indicator of the actual temperature of the substrate at the region associated with the first probe than are uncorrected readings of said first and second probes, said temperature measurement module programmed to derive a corrected temperature reading for the third probe from the adjustment temperature and the third temperature indication, wherein the corrected temperature reading for the third probe is a more accurate indicator of an actual temperature of the substrate in the environment of the third probe than are uncorrected readings produced by the third probe.

12. The apparatus of claim 11 wherein the first, second and third probes comprise light pipes.

13. The apparatus of claim 11 wherein the first, second and third probes are positioned in a first, a second and a third hole, respectively, said first, second and third holes formed in the reflecting plate, and where said second hole is larger than said first and said third holes.

14. The apparatus of claim 11 wherein said temperature measurement module computes a sensitivity factor for the third probe, and where the product of said sensitivity factor for the third probe and the adjustment temperature is summed with the third temperature indication to yield the corrected temperature reading for the third probe.

15. The apparatus of claim 14 wherein the sensitivity factor for the third probe is computed by determining the temperature variation from an average temperature applied for a plurality of calibration substrates having predetermined emissivity levels.

16. The apparatus of claim 15 wherein said plurality of calibration substrates includes at least one substrate having a high emissivity level, at least one having a low emissivity level and at least one having an emissivity level between the high and low levels.

17. The apparatus of claim 16 wherein the sensitivity factor for the third probe is determined by a straight line approximation of a sensitivity curve associated with the corrected temperature data derived for the first probe and the localized temperature variation from the average temperature applied for the calibration substrates.

* * * * *